US012805246B2

(12) United States Patent
Matsuoka

(10) Patent No.: US 12,805,246 B2
(45) Date of Patent: Nov. 17, 2026

(54) PICKUP METHOD AND PICKUP APPARATUS

(71) Applicant: DISCO CORPORATION, Tokyo (JP)

(72) Inventor: Yuya Matsuoka, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 27 days.

(21) Appl. No.: 18/670,982

(22) Filed: May 22, 2024

(65) Prior Publication Data

US 2024/0395575 A1 Nov. 28, 2024

(30) Foreign Application Priority Data

May 25, 2023 (JP) ................................ 2023-086159

(51) Int. Cl.
*B32B 43/00* (2006.01)
*H10P 72/00* (2026.01)

(52) U.S. Cl.
CPC ........ *H10P 72/0442* (2026.01); *B32B 43/006* (2013.01); *H10P 72/0606* (2026.01)

(58) Field of Classification Search
CPC .. H10P 72/0442; H10P 72/78; H10P 72/0606; B32B 43/006
USPC .......................................................... 156/765
See application file for complete search history.

(56) References Cited

U.S. PATENT DOCUMENTS 8,561,664 B2 * 10/2013 Maki .................. H10P 72/0442 156/707

FOREIGN PATENT DOCUMENTS

| | | | |
|---|---|---|---|
| JP | 05326672 | A | 12/1993 |
| JP | 2018063967 | A | 4/2018 |
| JP | 2021064813 | A | 4/2021 |

* cited by examiner

*Primary Examiner* — James D Sells
(74) *Attorney, Agent, or Firm* — Greer, Burns & Crain, Ltd.

(57) ABSTRACT

A pickup method for picking up a chip affixed to a tape from the tape, the pickup method including a partial peeling step of forming a peeled region in which a part of the chip is peeled from the tape and an affixed region in which a part including a peripheral edge of the chip is affixed to the tape, by thrusting up the chip by a thrust-up member via the tape while sucking and holding the tape on an outside of the chip to be picked up, and a pickup step of next peeling a whole area of the chip from the tape and picking up the chip by holding the peeled region of the chip by a chip holder and lifting the chip in a direction in which the chip is separated from the tape.

6 Claims, 14 Drawing Sheets

PICKUP METHOD AND PICKUP APPARATUS

BACKGROUND OF THE INVENTION

Field of the Invention

The present invention relates to a pickup method and a pickup apparatus that pick up a chip affixed to a tape from the tape.

Description of the Related Art

The handling of a wafer is facilitated by affixing the wafer to a tape in advance before the wafer is divided and separated into individual chips. The separated chips are picked up from the tape by a thrust-up pin (see Japanese Patent Laid-Open No. H05-326672, for example).

When a chip is thrust up by the thrust-up pin as disclosed in Japanese Patent Laid-Open No. H05-326672, a force is locally applied to the chip, causing damage to the chip. The risk of the damage is very high particularly in a case where the thickness of the chip is small, that is, equal to or less than 30 μm.

Accordingly, the chip is thrust up by a thrust-up member of a size corresponding to the chip, and is picked up from the tape (see Japanese Patent Laid-Open No. 2018-063967 and Japanese Patent Laid-Open No. 2021-064813).

SUMMARY OF THE INVENTION

In apparatuses as in Japanese Patent Laid-Open No. 2018-063967 and Japanese Patent Laid-Open No. 2021-064813, a thrust-up member corresponding to a chip size is prepared in advance, and when a chip of a different size is to be picked up, the thrust-up member is replaced with a thrust-up member corresponding to the chip to perform the pickup. However, managing the plurality of thrust-up members is troublesome, and there is a desire to reduce the number of man-hours involved in the replacement.

Accordingly, it is an object of the present invention to provide a pickup method and a pickup apparatus that can pick up a thinned chip from a tape without any damage to the chip and without replacement of a thrust-up member.

In accordance with an aspect of the present invention, there is provided a pickup method for picking up a chip affixed to a tape from the tape, the pickup method including a partial peeling step of forming a peeled region in which a part of the chip is peeled from the tape and an affixed region in which a part including a peripheral edge of the chip is affixed to the tape, by thrusting up the chip by a thrust-up member via the tape while sucking and holding the tape on an outside of the chip to be picked up, and a pickup step of next peeling a whole area of the chip from the tape and picking up the chip by holding the peeled region of the chip by a holder and lifting the chip in a direction in which the chip is separated from the tape.

Preferably, the chip has saw marks, and the partial peeling step peels a part of the chip such that a boundary line between the peeled region in which the chip is peeled from the tape and the affixed region in which the chip is affixed to the tape intersects the saw marks.

Preferably, the chip is formed by dividing a wafer, the pickup step picks up the chip to be picked up from the divided wafer affixed to the tape. The pickup method further includes a saw mark obtaining step of obtaining information on saw marks of the wafer before performing the partial peeling step, and a region classifying step of classifying the wafer into a plurality of regions on a basis of the saw marks obtained in the saw mark obtaining step, and. The partial peeling step peels a part of the chip such that the boundary line intersects the saw marks in each of the regions classified in the region classifying step.

In accordance with another aspect of the present invention, there is provided a pickup apparatus for picking up a chip affixed to a tape from the tape, the pickup apparatus including a thrust-up unit including a suction unit having a suction region configured to suck and hold the tape on an outside of the chip to be picked up and a raisable and lowerable thrust-up member disposed inside the suction region and having a pressing surface smaller than the chip to be picked up at a distal end of the thrust-up member, the thrust-up unit being configured to form a peeled region in which a part of the chip is peeled from the tape and form an affixed region in which a part of the chip is affixed to the tape, by thrusting up the chip via the tape, and a holder that is disposed on a side facing the thrust-up unit with the chip to be picked up interposed between the holder and the thrust-up unit, and has a holding surface smaller than the chip, the holding surface being configured to hold the peeled region of the chip thrust up by the thrust-up unit. The affixed region of the chip is peeled from the tape and the chip is picked up by moving the holder holding the peeled region of the chip in a direction in which the chip is separated from the tape.

Preferably, the chip has saw marks, and the thrust-up unit is positioned at the chip and thrusts up the chip such that a boundary line between the peeled region and the affixed region of the chip to be picked up intersects the saw marks.

Preferably, the pickup apparatus further includes a controller configured to control the thrust-up unit and the holder, and a saw mark detecting section configured to detect saw marks of a wafer. The controller includes a region classifying section configured to classify the wafer into a plurality of regions on a basis of the saw marks of the wafer, and in each of the regions classified by the region classifying section, the thrust-up unit is positioned at a same position with respect to the chip and thrusts up the chip, and the rectangular chip is peeled such that the boundary line between the peeled region and the affixed region intersects the saw marks.

The present invention produces an effect of being able to pick up a thinned chip from the tape without any damage to the thinned chip and without replacement of the thrust-up member.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

An Embodiment of the present invention will hereinafter be described in detail with reference to the drawings. The present invention is not limited by contents described in the following embodiment. In addition, constituent elements described in the following include constituent elements readily conceivable by those skilled in the art and essentially identical constituent elements. Further, configurations described in the following can be combined with each other as appropriate. In addition, various omissions, replacements, or modifications of configurations can be performed without departing from the spirit of the present invention.

Figure 1:
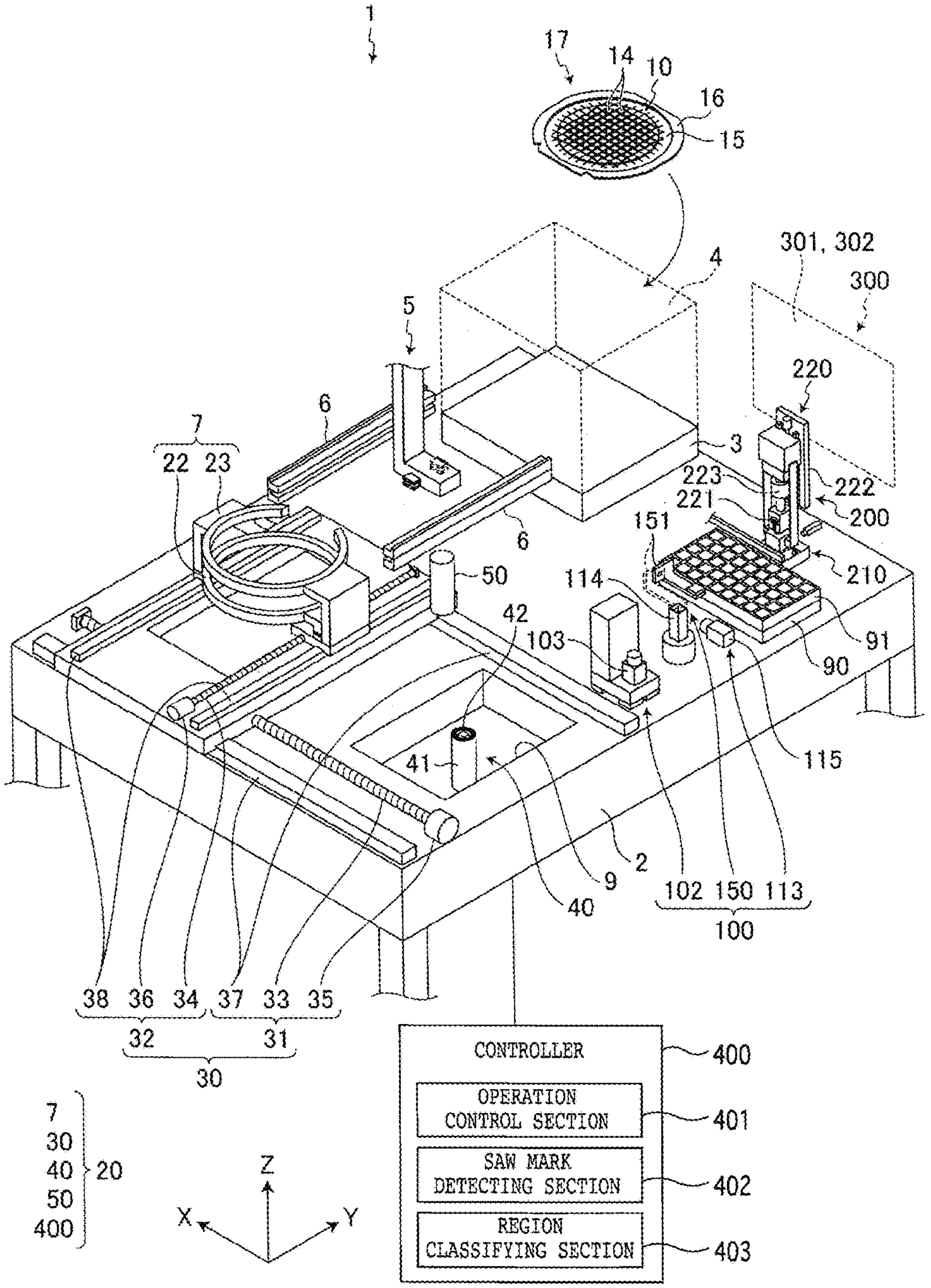
FIG. 1 is a perspective view illustrating a part of an example of a configuration of a test apparatus including a pickup apparatus according to an embodiment.
Figure 2:
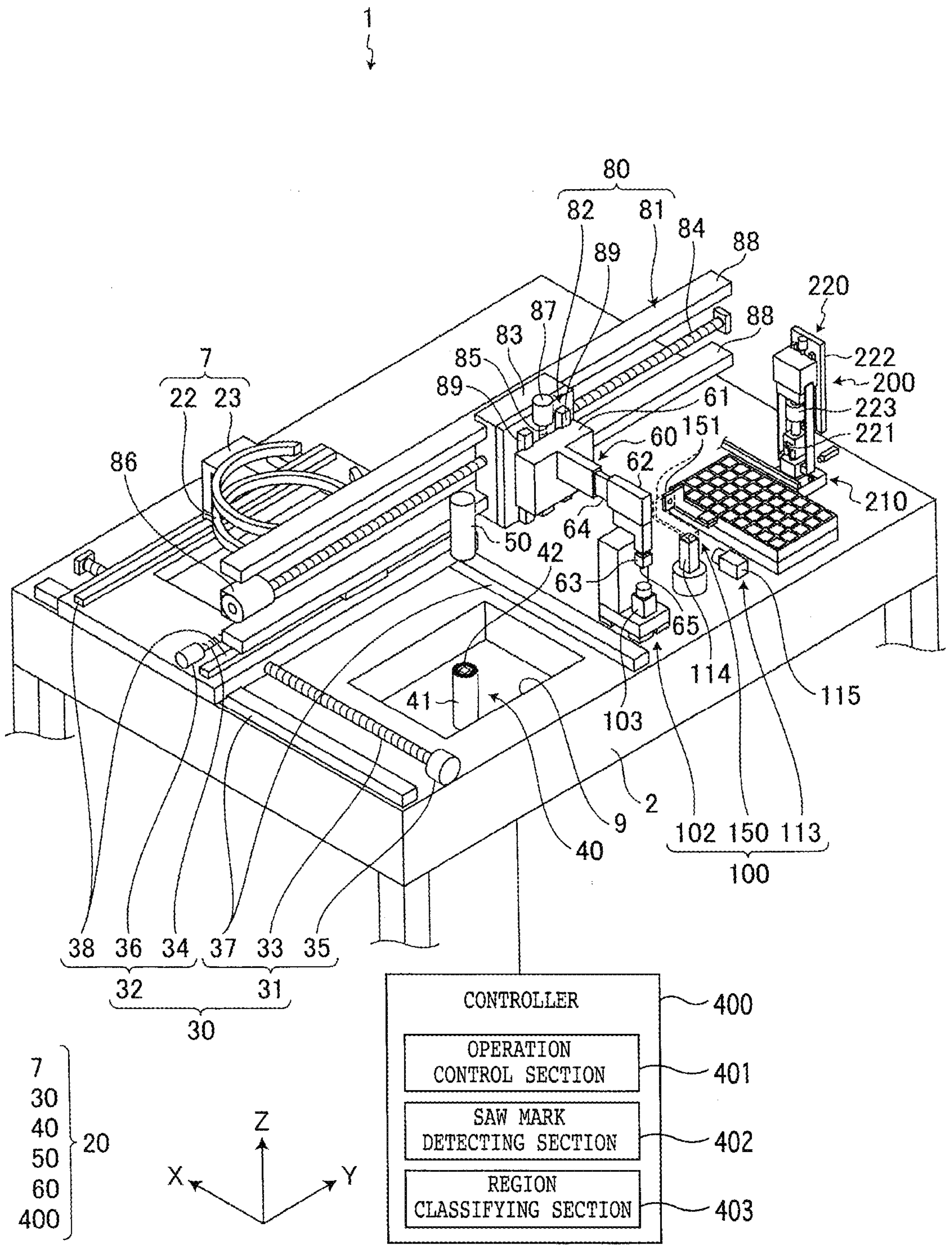
FIG. 2 is a perspective view of principal parts of the test apparatus illustrated in FIG. 1.
Figure 3:
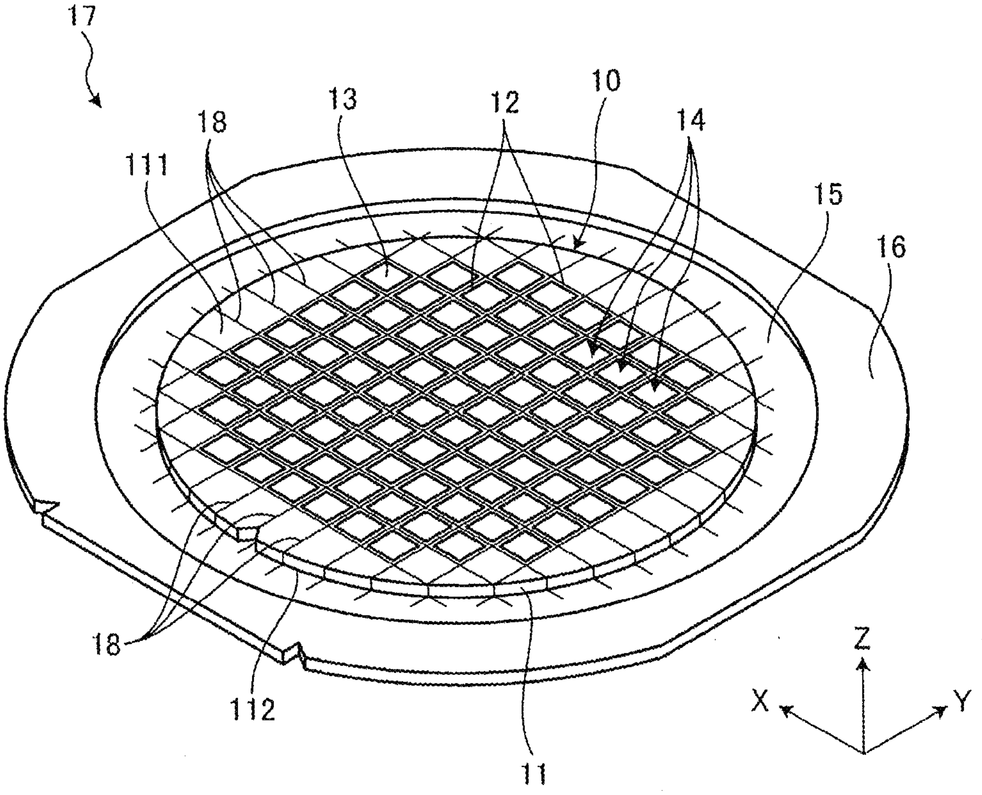
FIG. 3 is a perspective view schematically illustrating a wafer unit including a wafer divided into chips to be measured by the test apparatus illustrated in FIG. 1.
Figure 4:
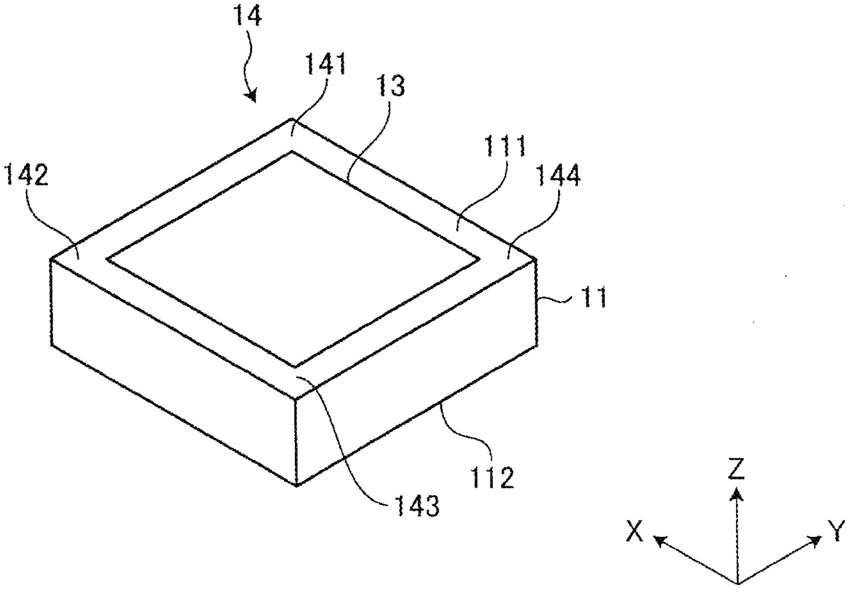
FIG. 4 is a perspective view schematically illustrating a chip divided from the wafer illustrated in FIG. 3.
Figure 5:
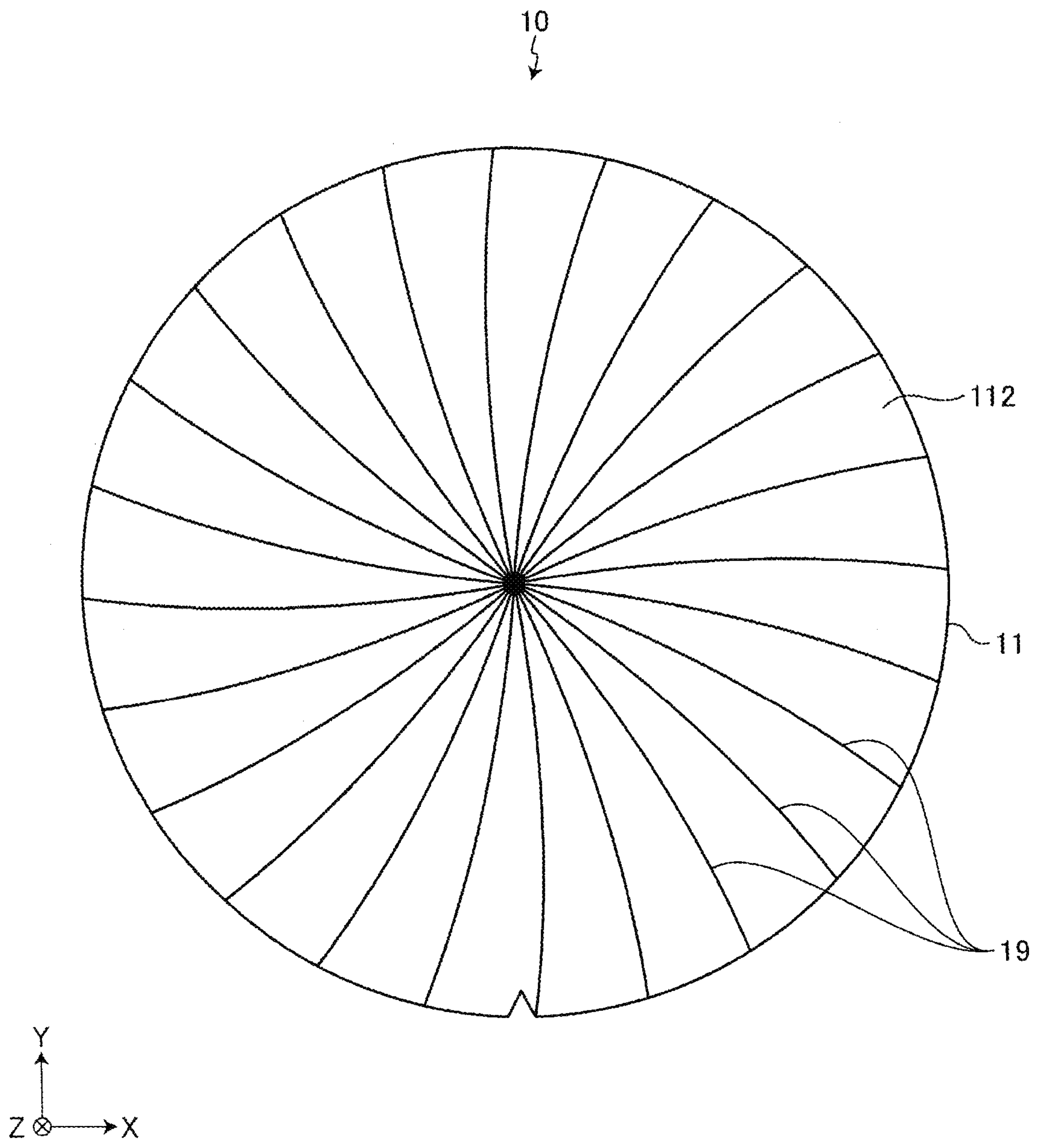
FIG. 5 is a plan view illustrating an undersurface of the wafer illustrated in FIG. 3.

A pickup apparatus according to an embodiment of the present invention will be described with reference to the drawings. FIG. 1 is a perspective view illustrating a part of an example of a configuration of a test apparatus including the pickup apparatus according to the embodiment. FIG. 2 is a perspective view of principal parts of the test apparatus illustrated in FIG. 1. FIG. 3 is a perspective view schematically illustrating a wafer unit including a wafer divided into chips to be measured by the test apparatus illustrated in FIG. 1. FIG. 4 is a perspective view schematically illustrating a chip divided from the wafer illustrated in FIG. 3. FIG. 5 is a plan view illustrating an undersurface of the wafer illustrated in FIG. 3.

A test apparatus 1 illustrated in FIG. 1 and FIG. 2 according to the embodiment is an apparatus that picks up a chip 14, which is a rectangular chip, from a tape 15 of a wafer unit 17 illustrated in FIG. 3, and measures a flexural strength of the chip 14 by destroying the chip 14.

In the embodiment, as illustrated in FIG. 3, the wafer unit 17 includes a wafer 10 divided into a plurality of chips 14, the tape 15 having the wafer 10 affixed thereto, and a frame 16 that houses the wafer 10 in an opening by having the periphery of the tape 15 affixed to the frame 16. The wafer 10 is a semiconductor wafer, an optical device wafer, or the like in a disk shape including silicon, sapphire, gallium, or the like as a substrate 11.

The wafer 10 has devices 13 formed in regions demarcated by a plurality of planned dividing lines 12 formed in a lattice manner on a top surface 111 of the substrate 11. In the embodiment, the tape 15 having the frame 16 fitted to the periphery thereof is affixed to an undersurface 112 of the wafer 10 on the reverse side of the top surface 111, and is supported by the frame 16. The wafer 10 thus constitutes the wafer unit 17.

In addition, the wafer 10 is thinned to a finished thickness by subjecting the undersurface 112 of the wafer 10 to grinding processing, and the wafer 10 is divided into individual chips 14 by performing cutting processing or the like along the planned dividing lines 12. In the embodiment, the finished thickness of the wafer 10, that is, the chips 14 is equal to or more than 5 μm and equal to or less than 30 μm. That is, in the wafer 10, cut grooves 18 that penetrate the wafer 10 itself are formed between adjacent ones of the chips 14. As illustrated in FIG. 4, a chip 14 is constituted by a part of the substrate 11 and a device 13, and has a rectangular planar shape. The chip 14 has the top surface 111, the undersurface 112 on the reverse side of the top surface 111, and a plurality of side surfaces extending from the top surface 111 to the undersurface 112.

The tape 15 includes a base material layer formed by a flexible and non-adhesive resin, and a glue layer laminated to the base material layer, formed by a flexible and adhesive resin, and adhering to the wafer 10 and the frame 16.

Incidentally, while the wafer 10 has the devices 13 formed on the top surface 111 of the substrate 11 in the embodiment, the devices 13 may not be formed on the top surface 111 in a case where the test apparatus 1 is used to evaluate the appropriateness of processing conditions of what is called a back-end process in which the wafer 10 is divided into individual chips 14 in the present invention.

In addition, in the embodiment, the wafer 10 is thinned to a predetermined finished thickness by subjecting the undersurface 112 of the wafer 10 to grinding processing or the like, and is divided into individual chips 14 by forming the cut grooves 18 in the planned dividing lines 12. Therefore, at a time of the grinding processing, as illustrated in FIG. 5, minute irregularities referred to as saw marks 19 (referred to also as processing traces) is formed on the undersurface 112 of the wafer 10. That is, the chips 14 have the saw marks 19 on the undersurface 112. Incidentally, the cut grooves 18 are omitted in FIG. 5. Incidentally, in the example illustrated in FIG. 5, the saw marks 19 extend from a center of the undersurface 112 of the wafer 10 to an outer circumference edge portion thereof, and curve in a mutually same direction between the center and the outer circumference edge portion.

Incidentally, the shape and position of the saw marks 19 are determined by processing conditions at the time of the grinding processing (for example, the outside diameter of the wafer 10, the outside diameter of a grinding wheel, the rotational direction and rotational speed of a chuck table, and the rotational direction and rotational speed of the grinding wheel), and can be estimated on the basis of these processing conditions.

As illustrated in FIG. 1, the test apparatus 1 includes a cassette mounting base 3 that is provided on an apparatus main body 2 and on which a cassette 4 housing a plurality of wafer units 17 is mounted a loading and unloading unit 5 that loads and unloads a wafer unit 17 into and from the cassette 4 a pair of temporary placement rails 6 on which a wafer unit 17 unloaded from the cassette 4 or a wafer unit 17 before being loaded into the cassette 4 is temporary placed a pickup apparatus 20 according to the embodiment a holder moving unit 80 as a moving unit (illustrated in FIG. 2); a chip observation mechanism 100 and a strength measuring unit 200 as a measuring unit.

The cassette 4 is a housing container that houses the plurality of wafer units 17 at intervals in a Z-axis direction parallel with a vertical direction. The cassette 4 is provided with an opening for loading or unloading a wafer unit 17. The cassette 4 is mounted on an upper surface of the cassette mounting base 3. The cassette mounting base 3 raises or lowers the cassette 4 in the Z-axis direction.

The pair of temporary placement rails 6 is provided on the apparatus main body 2 and at both ends in the width direction of the opening 8 of the cassette 4 mounted on the cassette mounting base 3, and extends linearly in a Y-axis direction parallel with a horizontal direction. The pair of temporary placement rails 6 is arranged in parallel with each other, and is arranged at intervals from each other along an X-axis direction orthogonal to the Y-axis direction and parallel with the horizontal direction. The frame 16 of the wafer unit 17 is temporarily placed on the pair of temporary placement rails 6.

The loading and unloading unit 5 is provided so as to be movable in the Y-axis direction by a moving mechanism not illustrated in the figures. The loading and unloading unit 5 unloads a wafer unit 17 from the cassette 4 and temporarily places the wafer unit 17 on the temporary placement rails 6, thereafter takes out the wafer unit 17 to an upper surface of a lowered frame supporting member 22 of a frame fixing unit 7 of the pickup apparatus 20, and mounts the wafer unit 17 on the upper surface of the frame supporting member 22. In addition, the loading and unloading unit 5 loads a wafer unit 17 on the upper surface of the lowered frame supporting member 22 of the frame fixing unit 7 into the cassette 4 via the temporary placement rails 6.

The pickup apparatus 20 is an apparatus that picks up a chip 14 from the tape 15 of the wafer unit 17 described above. As illustrated in FIG. 2, the pickup apparatus 20 includes the frame fixing unit 7, a moving mechanism 30 for moving the frame fixing unit 7 in the Y-axis direction and the X-axis direction, a thrust-up unit 40 as a thrust-up member, an imaging camera 50, a pickup mechanism 60, and a controller 400.

The frame fixing unit 7 holds and fixes the frame 16 disposed on the periphery of the wafer 10 on the tape 15 of the wafer unit 17, that is, the frame 16 disposed on the periphery of the chips 14 to be picked up. The frame fixing unit 7 is installed on a moving table 21. The frame fixing unit 7 includes the frame supporting member 22 in an annular shape, a frame holding member 23 in an annular shape, the frame holding member 23 being disposed above the frame supporting member 22 and fixed, and a raising and lowering mechanism not illustrated, which raises and lowers the frame supporting member 22.

Before the frame supporting member 22 is raised, the upper surface of the frame supporting member 22 is positioned on a same plane as an upper surface of the temporary placement rails 6, and the frame 16 of the wafer unit 17 is mounted on the frame supporting member 22. After the frame 16 of the wafer unit 17 is mounted on the upper surface of the frame supporting member 22, the raising and lowering mechanism raises the frame supporting member 22, and the frame fixing unit 7 sandwiches the frame 16 between the frame holding member 23 and the frame supporting member 22. By sandwiching the frame 16 between the frame holding member 23 and the frame supporting member 22, the frame fixing unit 7 holds and fixes the frame 16 disposed on the periphery of the wafer 10 on the tape 15, and thus fixes the wafer unit 17.

The moving mechanism 30 includes an X-axis moving mechanism 31 that is provided on the apparatus main body 2 and moves the moving table 21 in the X-axis direction, and a Y-axis moving mechanism 32 that is provided on the moving table 21 moved in the X-axis direction by the X-axis moving mechanism 31 and moves the frame fixing unit 7 in the Y-axis direction. The X-axis moving mechanism 31 moves the moving table 21, that is, the frame fixing unit 7 in the X-axis direction between a position aligned with the pair of temporary placement rails 6 in the Y-axis direction and a position separated from the pair of temporary placement rails 6. The moving mechanisms 31 and 32 include well-known ball screws 33 and 34 provided so as to be rotatable about axes thereof, well-known motors 35 and 36 that rotate the ball screws 33 and 34 about the axes, and well-known guide rails 37 and 38 that movably support the moving table 21 or the frame fixing unit 7 in the X-axis direction or the Y-axis direction.

Figure 6:
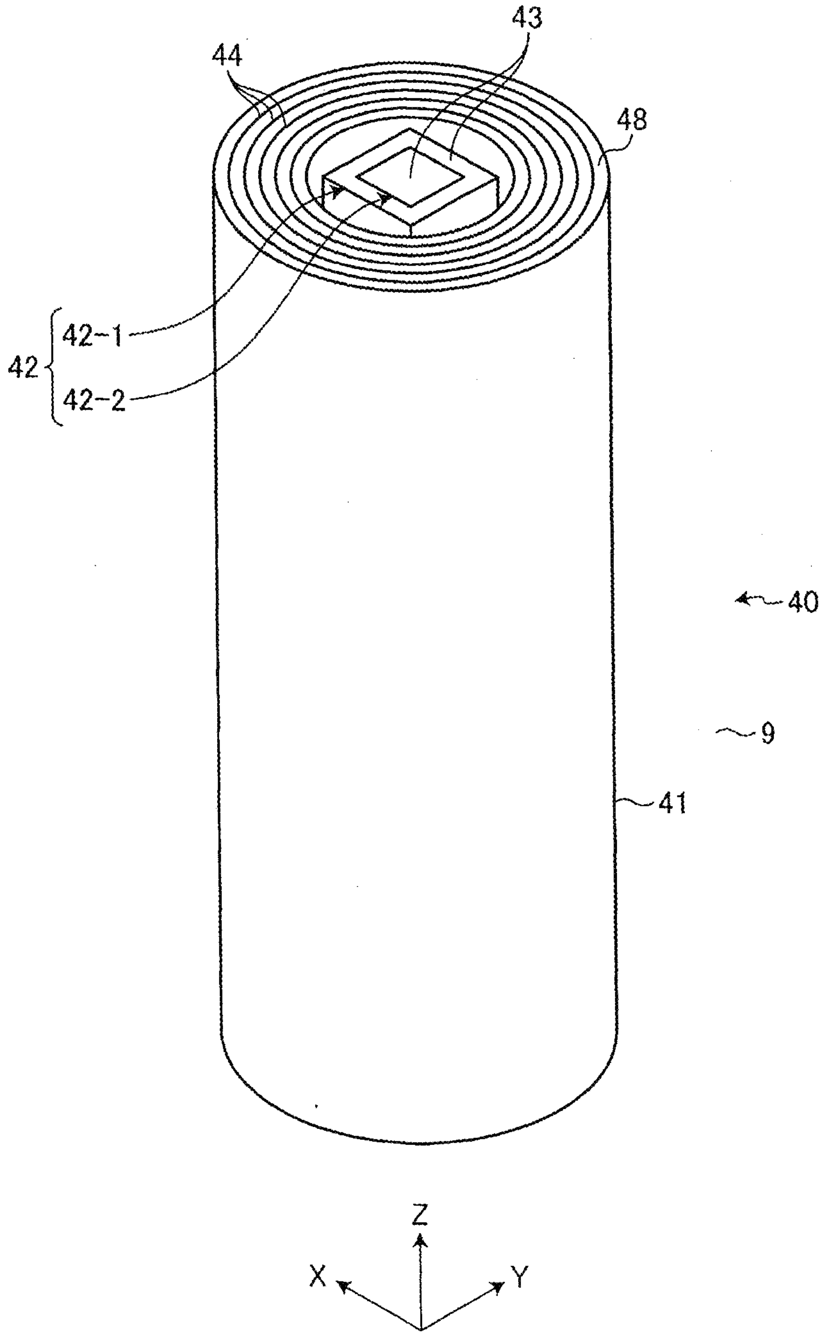
FIG. 6 is a perspective view schematically illustrating a thrust-up unit and the like of the pickup apparatus according to the embodiment.
Figure 7:
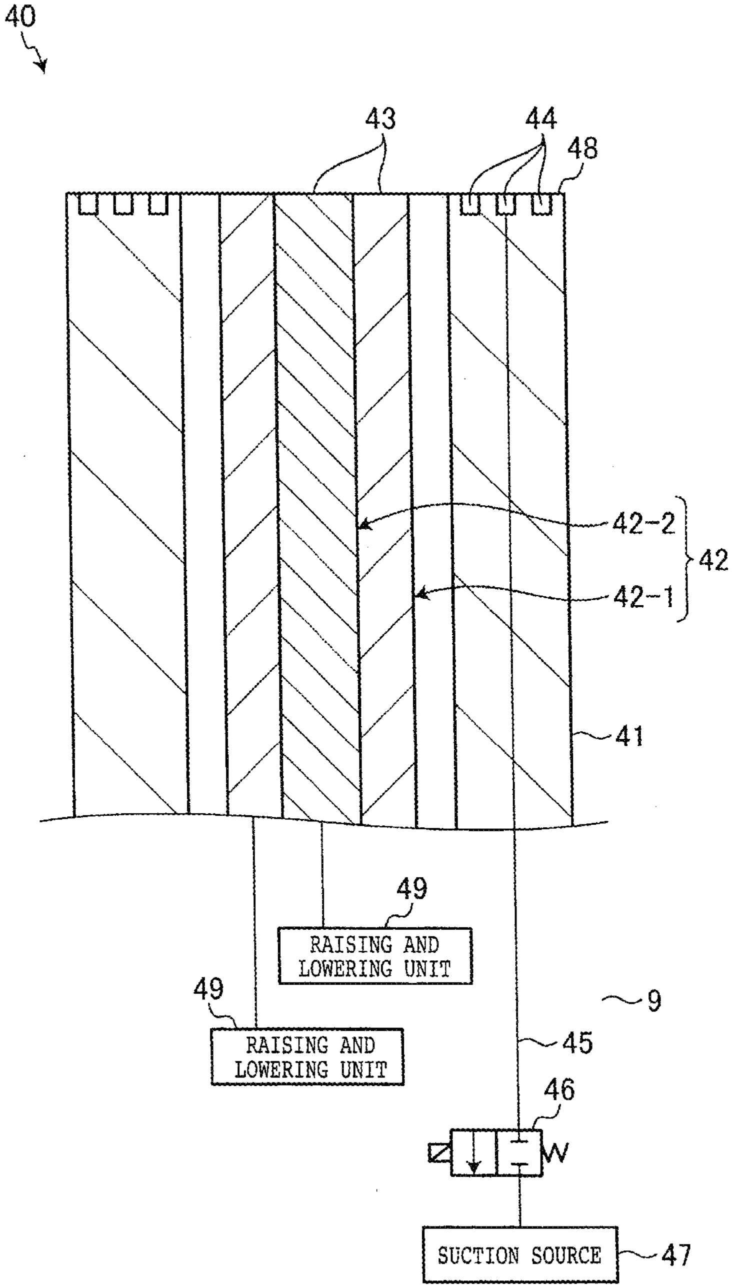
FIG. 7 is a sectional view schematically illustrating the thrust-up unit and the like of the pickup apparatus according to the embodiment.
Figure 8:
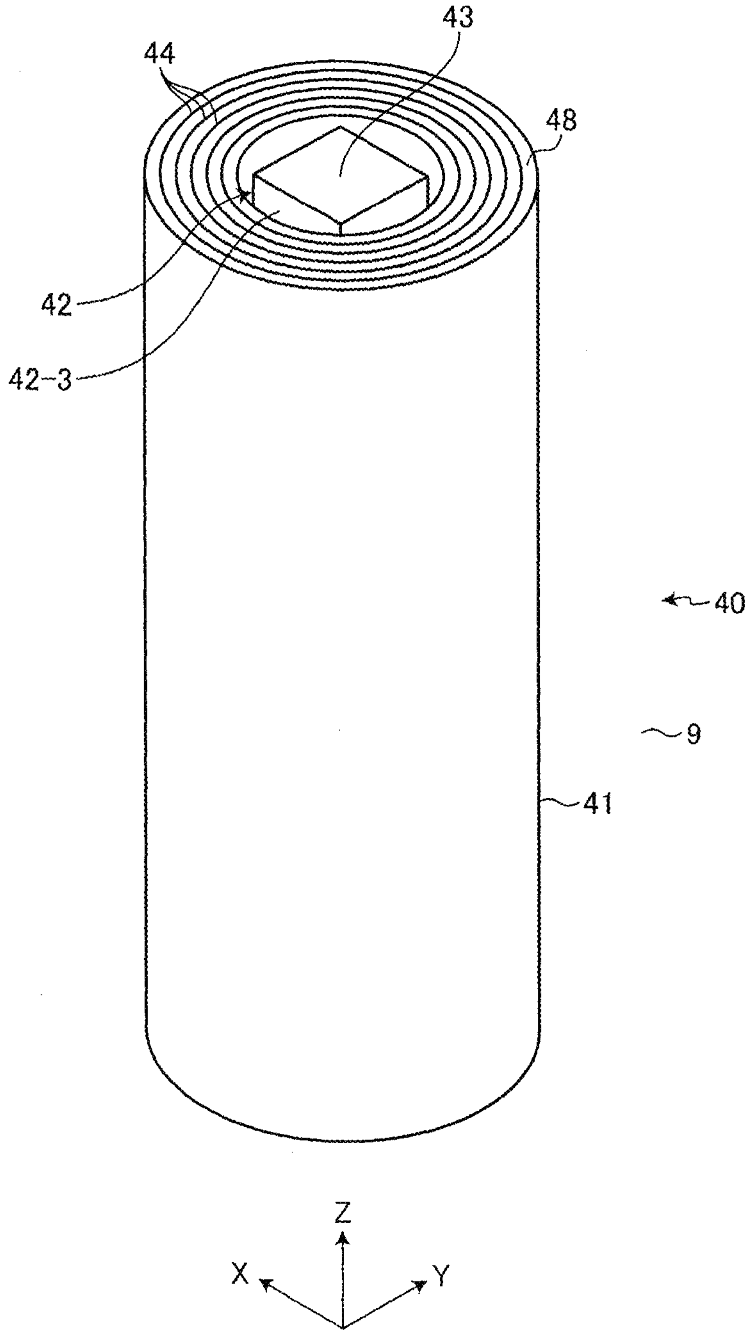
FIG. 8 is a perspective view schematically illustrating a modification of the thrust-up unit and the like illustrated in FIG. 6.
Figure 9:
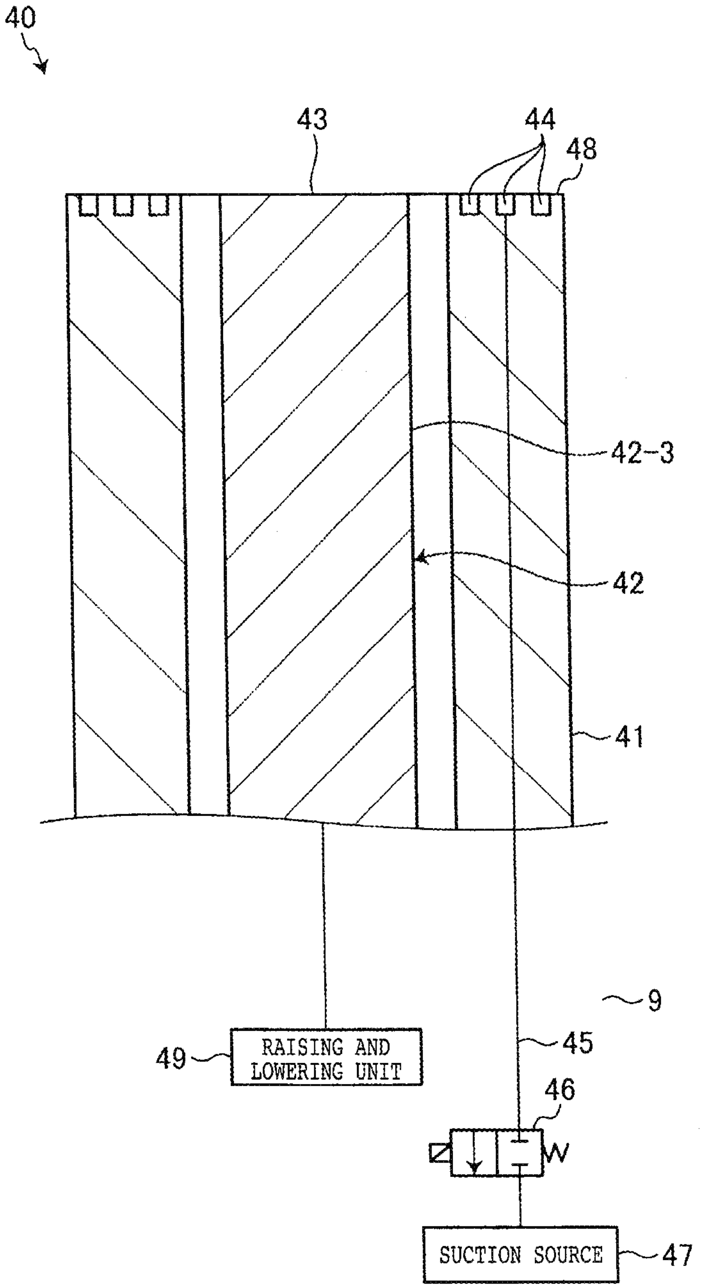
FIG. 9 is a sectional view schematically illustrating the thrust-up unit and the like illustrated in FIG. 8.

FIG. 6 is a perspective view schematically illustrating the thrust-up unit and the like of the pickup apparatus according to the embodiment. FIG. 7 is a sectional view schematically illustrating the thrust-up unit and the like of the pickup apparatus according to the embodiment. FIG. 8 is a perspective view schematically illustrating a modification of the thrust-up unit and the like illustrated in FIG. 6. FIG. 9 is a sectional view schematically illustrating the thrust-up unit and the like illustrated in FIG. 8.

The thrust-up unit 40 thrusts up a chip 14 via the tape 15, and thereby forms a peeled region 145 (illustrated in FIG. 14 and the like) in which a part of the chip 14 is peeled from the tape 15 and forms an affixed region 146 (illustrated in FIG. 14 and the like) in which a part of the chip 14 is affixed to the tape 15. Incidentally, the peeled region 145 is a region in which the undersurface 112 of the chip 14 is peeled from the tape 15. In the embodiment, the peeled region 145 is formed also in a central portion of the chip 14. In addition, the affixed region 146 is a region in which the undersurface 112 of the chip 14 is affixed to the tape 15. In the embodiment, the affixed region 146 is formed also at a peripheral edge of the chip 14.

The thrust-up unit 40 is disposed below the frame fixing unit 7 positioned at a position separated from the pair of temporary placement rails 6 by the X-axis moving mechanism 31. The thrust-up unit 40 is provided within a recessed portion 9 of the apparatus main body 2. The thrust-up unit 40 thrusts up any one of the chips 14 via the tape 15 of the wafer unit 17 fixed by the frame fixing unit 7 positioned at the position separated from the pair of temporary placement rails 6 by the X-axis moving mechanism 31.

The thrust-up unit 40 is integrally connected as a whole to a raising and lowering mechanism (not illustrated) constituted by a motor or the like, so that the thrust-up unit 40 is raised or lowered along the Z-axis direction. As illustrated in FIG. 6 and FIG. 7, the thrust-up unit 40 includes a tape holding unit 41 as a sucking unit formed in a hollow cylindrical shape and a thrust-up unit 42 in a quadrangular prismatic shape disposed in the tape holding unit 41. An upper surface 48 of the tape holding unit 41 is a suction region that is formed so as to be flat in parallel with the horizontal direction and which sucks and holds the tape 15 on the periphery (corresponding to the outside) of the chip 14 to be picked up. A plurality of suction grooves 44 are formed on the upper surface 48 of the tape holding unit 41, the plurality of suction grooves 44 being formed concentrically along the circumferential direction of the tape holding unit 41. The suction grooves 44 are each connected to a suction source 47 formed by an ejector or the like via a suction passage 45 formed in the thrust-up unit 40 and an opening and closing valve 46.

The thrust-up unit 42 is formed in a quadrangular shape in which the planar shape of an upper surface of the thrust-up unit 42 is smaller than the planar shape of the chip 14. The thrust-up unit 42 includes a first thrust-up member 42-1 formed in a square tubular shape and a second thrust-up member 42-2 formed in a quadrangular prismatic shape and housed in the first thrust-up member 42-1. The first thrust-up member 42-1 and the second thrust-up member 42-2 are respectively connected to raising and lowering units 49 formed by a motor or the like, and can therefore be raised and lowered along the Z-axis direction independently of each other.

The first thrust-up member 42-1 and the second thrust-up member 42-2 are raised by the raising and lowering units 49, and thereby thrust up the chip 14 to be picked up via the tape 15. In addition, upper surfaces 43 of the first thrust-up member 42-1 and the second thrust-up member 42-2 are each a pressing surface that is formed so as to be smaller than the planar shape of the chip 14 to be picked up and which thrusts up the chip 14 to be picked up via the tape 15. That is, the thrust-up members 42-1 and 42-2 have, at distal ends thereof, the upper surfaces 43 as a pressing surface smaller than the chip 14 to be picked up, and are raisable and lowerable by the raising and lowering units 49.

In a state in which the wafer unit 17 including the frame 16 held by the frame fixing unit 7 is positioned on the thrust-up unit 40, the suction grooves 44 of an upper surface 48 of the tape holding unit 41 are sucked by the suction source 47, and the thrust-up unit 40 thereby sucks and holds the tape 15 on the periphery of the chip 14 to be picked up on the upper surface 48 of the tape holding unit 41. When the thrust-up unit 40 sucks and holds the tape 15 on the periphery of the chip 14 to be picked up on the upper surface 48 of the tape holding unit 41, and each of the thrust-up members 42-1 and 42-2 of the thrust-up unit 42 is raised, the thrust-up unit 40 thrusts up the chip 14 to above the tape 15, and thereby forms the peeled region 145 and the affixed region 146 described above in the chip 14.

In the embodiment, when the thrust-up unit 40 thrusts up the chip 14, the raising and lowering units 49 start to raise the first thrust-up member 42-1 and the second thrust-up member 42-2 simultaneously at a same speed, raises the second thrust-up member 42-2 to above the first thrust-up member 42-1, and stops raising each of the first thrust-up member 42-1 and the second thrust-up member 42-2. That is, when the thrust-up unit 40 thrusts up the chip 14, the first thrust-up member 42-1 and the second thrust-up member 42-2 start to be raised simultaneously at the same speed, and the first thrust-up member 42-1 and the second thrust-up member 42-2 stop being raised sequentially.

In addition, in the present invention, as illustrated in FIG. 8 and FIG. 9, the thrust-up members 42-1 and 42-2 may be formed integrally with each other, and the thrust-up unit 40 may include only one thrust-up member 42-3. Incidentally, in FIG. 8 and FIG. 9, parts identical to those of the embodiment are identified by the same reference numerals, and description thereof will be omitted. The thrust-up unit 40 illustrated in FIG. 8 and FIG. 9 includes only one thrust-up member 42-3 in a quadrangular prismatic shape that has the upper surface 43 as a pressing surface at a distal end thereof and which is raisable and lowerable by the raising and lowering units 49.

The imaging camera 50 is disposed above the frame fixing unit 7 positioned at the position separated from the pair of temporary placement rails 6 by the X-axis moving mechanism 31. The imaging camera 50 forms a captured image by imaging the chip 14 to be thrust up by the thrust-up members 42-1 and 42-2 of the thrust-up unit 40 and the periphery of the chip 14 in the wafer 10 of the wafer unit 17 including the frame 16 held by the frame fixing unit 7 positioned at the position separated from the pair of temporary placement rails 6 by the X-axis moving mechanism 31.

The imaging camera 50 includes an imaging element (that is, pixels) that images the chip 14 to be thrust up by the thrust-up members 42-1 and 42-2 of the thrust-up unit 40 and the periphery of the chip 14 in the wafer 10 of the wafer unit 17 including the frame 16 held by the frame fixing unit 7. The imaging element is, for example, a charge-coupled device (CCD) imaging element or a complementary metal-oxide semiconductor (CMOS) imaging element. The imaging camera 50 photographs the chip 14 to be thrust up by the thrust-up members 42-1 and 42-2 of the thrust-up unit 40 and the periphery of the chip 14 in the wafer 10 of the wafer unit 17 including the frame 16 held by the frame fixing unit 7, thereby obtains a captured image for performing alignment between the chip 14 to be thrust up by the thrust-up unit 40 and picked up in the wafer 10 and the thrust-up unit 40 or the like, and outputs the obtained captured image to the controller 400.

The pickup mechanism 60 picks up the chip 14 thrust up by the thrust-up unit 40 from the wafer 10 divided into the plurality of chips 14 and supported by the tape 15. The pickup mechanism 60 includes a moving base 61 moved in the Y-axis direction and the Z-axis direction by the holder moving unit 80, an arm 62 extending from the moving base 61 in a direction in which the arm 62 is separated from the holder moving unit 80 in the X-axis direction, a chip holder 63 that is provided at a distal end of the arm 62 and which holds the chip 14, and an extending and contracting unit 64 that extends and contracts an entire length of the arm 62.

The chip holder 63 is disposed on a side facing the thrust-up members 42-1 and 42-2 of the thrust-up unit 40 such that the chip 14 to be picked up in the wafer unit 17 fixed by the frame fixing unit 7 positioned at the position separated from the pair of temporary placement rails 6 by the X-axis moving mechanism 31 is interposed between the chip holder 63 and the thrust-up members 42-1 and 42-2. In addition, the chip holder 63 has a lower surface 65 as a holding surface that is smaller than the planar shape of the chip 14 and which faces the chip 14 to be picked up. Suction grooves connected to a suction source such as an ejector via a suction passage and an opening and closing valve not illustrated in the figures are formed in the lower surface 65. The lower surface 65 sucks and holds the peeled region 145 of the chip 14 thrust up by the thrust-up members 42-1 and 42-2 of the thrust-up unit 40.

In a state in which the lower surface 65 of the chip holder 63 is set in contact with the chip 14 thrust up by the thrust-up members 42-1 and 42-2, the suction grooves are sucked by the suction source 68, and the chip holder 63 thereby sucks and holds the chip 14 on the lower surface 65. The chip holder 63 sucks and holds the chip 14 thrust up by the thrust-up members 42-1 and 42-2 of the thrust-up unit 40 on the lower surface 65, and is raised by the holder moving unit 80. The chip holder 63 thereby picks up the chip 14 sucked and held on the lower surface 65 from the tape 15.

In addition, in the embodiment, the test apparatus 1 may include, on the upper surface side of the thrust-up unit 40, a load cell as measuring means for measuring a load applied to the chip 14 when the chip 14 is to be picked up from the tape 15. The load cell outputs a measurement result to the controller 400. Incidentally, in the present invention, the load cell as measuring means may be provided on the lower surface 65 side of the chip holder 63 of the pickup mechanism 60.

The holder moving unit 80 moves the chip holder 63 along the Z-axis direction and the Y-axis direction. The holder moving unit 80 moves the chip holder 63 between a pickup position at which the chip 14 is picked up from the tape 15 and a measurement position at which the chip 14 is mounted on a pair of supporting portions of a supporting unit 210 of the strength measuring unit 200 and the flexural strength of the chip 14 is measured by the strength measuring unit 200. By moving the chip holder 63 between the pickup position and the measurement position, the holder moving unit 80 transports the chip 14 picked up by the chip holder 63 to the supporting unit 210 of the strength measuring unit 200.

As illustrated in FIG. 2, the holder moving unit 80 includes a second Y-axis moving mechanism 81 that is provided on the apparatus main body 2 and moves a moving table 83 in the Y-axis direction, and a Z-axis moving mechanism 82 that is provided on the moving table 83 moved in the Y-axis direction by the second Y-axis moving mechanism 81 and moves the moving base 61, that is, the pickup mechanism 60 in the Z-axis direction.

The second Y-axis moving mechanism 81 moves the moving table 83, that is, the pickup mechanism 60 from the pickup position, at which the upper surface 48 of the tape holding unit 41 of the thrust-up unit 40 and the lower surface 65 of the chip holder 63 face each other in the Z-axis direction, to the strength measuring unit 200 along the Y-axis direction. The moving mechanisms 81 and 82 include well-known ball screws 84 and 85 provided so as to be rotatable about axes thereof, well-known motors 86 and 87 that rotate the ball screws 84 and 85 about the axes, and well-known guide rails 88 and 89 that movably support the moving table 83 or the pickup mechanism 60 in the Y-axis direction or the Z-axis direction.

The chip observation mechanism 100 images and observes the top surface 111, the undersurface 112, and side surfaces of the chip 14. As illustrated in FIG. 1 and FIG. 2, the chip observation mechanism 100 includes a lower side imaging unit 102 disposed on the apparatus main body 2 so as to be next to the thrust-up unit 40 in the Y-axis direction, a side imaging unit 113, and a chip inverting mechanism 150 that vertically inverts the chip 14.

The lower side imaging unit 102 includes a lower side imaging camera 103 that images the chip 14 held by the chip holder 63 of the pickup mechanism 60 from below. The lower side imaging camera 103 is disposed at a position overlapping the movement path of the chip holder 63. The lower side imaging camera 103 of the lower side imaging unit 102 images the chip 14 from below, and the lower side imaging unit 102 outputs the captured image to the controller 400.

The side imaging unit 113 images the chip 14 from a side, that is, a side surface of the chip 14. The side imaging unit 113 is disposed next to the lower side imaging unit 102 in the Y-axis direction. In the embodiment, the side imaging unit 113 is disposed on a side more distant from the thrust-up unit 40 than the lower side imaging unit 102.

The side imaging unit 113 includes a columnar chip support base 114 that supports the chip 14, and a side surface imaging camera 115 that images a side surface of the chip 14.

The chip support base 114 extends upward from the apparatus main body 2, and is disposed at a position aligned with the lower side imaging camera 103 in the Y-axis direction (that is, at a position overlapping the movement path of the chip holder 63). The chip support base 114 has an upper surface thereof formed so as to be flat in parallel with the horizontal direction. The chip support base 114 supports, on the upper surface, the chip 14 transported by the chip holder 63 of the pickup mechanism 60. In addition, the chip support base 114 is connected to a rotational driving source not illustrated in the figures, and is rotated about an axis parallel with the Z-axis direction by the rotational driving source.

The side surface imaging camera 115 is disposed at a position at which the side surface imaging camera 115 can photograph a side surface of the chip 14 disposed on the upper surface of the chip support base 114. The side surface imaging camera 115 includes an imaging element that images a side surface of the chip 14. The imaging element is, for example, a CCD imaging element or a CMOS imaging element. The side surface imaging camera 115 images a side surface of the chip 14 disposed on the upper surface of the chip support base 114, and outputs the captured image by the imaging to the controller 400.

Incidentally, because the chip support base 114 is provided at a position overlapping the movement path of the chip holder 63, the test apparatus 1 can dispose the chip 14 on the upper surface of the chip support base 114 by the chip holder 63.

The side imaging unit 113 images one side surface of the chip 14 supported by the chip support base 114 by the side surface imaging camera 115. Then, after the chip support base 114 is rotated by a predetermined angle, another side surface of the chip 14 is imaged by the side surface imaging camera 115. Thus, the side imaging unit 113 images all of the side surfaces of the chip 14 (for example, the side surfaces of four sides of the chip 14) by the side surface imaging camera 115, thereby obtains images including the thickness of the chip 14, the size of a chipping formed on the chip 14, and the like, and outputs the obtained images to the controller 400. In addition, by controlling the rotational angle of the chip support base 114, the side imaging unit 113 can adjust the orientation (angle) in the horizontal direction of the chip 14 at a time that the chip 14 is disposed on the strength measuring unit 200.

The chip observation mechanism 100 images the top surface 111, the undersurface 112, and the side surfaces of the chip 14 picked up by the chip holder 63 by the lower side imaging unit 102 and the side imaging unit 113 described above. Incidentally, in the present invention, the side surface imaging camera 115 that images a side surface of the chip 14 may be provided at a position at which the side surface imaging camera 115 can image a side surface of the chip 14 in a state of being held by the chip holder 63. In this case, a side surface of the chip 14 can be observed without the chip 14 being supported by the chip support base 114. The undersurface 112 of the chip 14 or the like can therefore be prevented from being damaged by disposing the chip 14 on the chip support base 114.

The chip inverting mechanism 150 is disposed above the chip support base 114 of the side imaging unit 113. The chip inverting mechanism 150 is configured to be able to rotate a base portion 151 about an axis parallel with the X-axis direction by 180° in a state in which the chip inverting mechanism 150 holds the chip 14 at a distal end portion thereof.

When vertically inverting the chip 14, the chip inverting mechanism 150 rotates the base portion 151 by 180° from a position indicated by a solid line in FIG. 1 and FIG. 2 with respect to the upper surface of the chip support base 114 supporting the chip 14, and thereby positions the base portion 151 at a position indicated by a dotted line in FIG. 1 and FIG. 2. The chip inverting mechanism 150 sucks and holds the chip 14 at the distal end portion thereof, and rotates the base portion 151 by 180°. The chip inverting mechanism 150 thereby vertically inverts the chip 14.

The chip holder 63 of the pickup mechanism 60 sucks and holds the chip 14 inverted by the chip inverting mechanism 150. After the sucking and holding of the chip 14 by the distal end portion of the chip inverting mechanism 150 is stopped, the chip holder 63 moved by the holder moving unit 80 transports the chip 14 to a position above the lower side imaging unit 102 or to the strength measuring unit 200. The chip inverting mechanism 150 thus vertically inverts the chip 14.

The strength measuring unit 200 is a measuring unit that measures the flexural strength of the chip 14 picked up by the pickup mechanism 60. The strength measuring unit 200 is disposed next to the chip observation mechanism 100 in the Y-axis direction. In the embodiment, the strength measuring unit 200 is disposed on a side more distant from the thrust-up unit 40 than the chip observation mechanism 100. In addition, in the embodiment, the strength measuring unit 200 is disposed at a position overlapping the movement path of the chip holder 63.

The strength measuring unit 200 includes a supporting unit 210 and a pressing unit 220. The supporting unit 210 supports the chip 14 picked up by the chip holder 63 of the pickup mechanism 60 and having the top surface 111, the undersurface 112, and the side surfaces imaged by the chip observation mechanism 100. The supporting unit 210 is disposed at a position overlapping the movement path of the chip holder 63. The holder moving unit 80 therefore moves the chip holder 63 from a position facing the thrust-up unit 40 in the Z-axis direction to a position facing the supporting unit 210 in the Z-axis direction.

The supporting unit 210 includes a pair of supporting portions that are arranged at a predetermined interval and support the undersurface 112 of the chip 14. The pair of supporting portions is arranged at the predetermined interval from each other in the X-axis direction.

The pressing unit 220 presses the chip 14 supported by the supporting unit 210 by an indenter 221, measures a load applied to the pressing unit 220 at a time of pressing the chip 14, and destroys the chip 14 supported by the supporting unit 210 by pressing the chip 14. The pressing unit 220 is provided above the supporting unit 210.

As illustrated in FIG. 1 and FIG. 2, the pressing unit 220 includes the indenter 221, an indenter moving unit 222, and a load measuring instrument 223.

The indenter 221 is disposed above the supporting unit 210 and above between the pair of supporting portions that support the undersurface 112 of the chip 14. The indenter moving unit 222 moves the indenter 221 into relative proximity to the chip 14 supported by the pair of supporting portions along the Z-axis direction. The indenter moving unit 222 supports the indenter 221 at a lower end thereof, thereby makes the indenter 221 face a space between the pair of supporting portions of the supporting unit 210 along the Z-axis direction, and vertically moves the indenter 221 along the Z-axis direction.

The load measuring instrument 223 measures a load when the indenter 221 presses the chip 14 supported by the supporting portions. In the embodiment, the indenter moving unit 222 vertically moves the load measuring instrument 223 along the Z-axis direction together with the indenter 221. The load measuring instrument 223 is constituted by a well-known load cell or the like. The load measuring instrument 223 measures the load when the indenter 221 presses the chip 14 supported by the pair of supporting portions, and outputs a measurement result to the controller 400.

When the strength measuring unit 200 is to measure the flexural strength of the chip 14, the chip holder 63 or the like mounts the chip 14 on the pair of supporting portions. At this time, both end portions of the chip 14 are supported by the pair of supporting portions, and a central portion of the chip 14 overlaps the space between the pair of supporting portions.

The strength measuring unit 200 lowers the indenter 221 by the indenter moving unit 222, presses the chip 14 by the indenter 221, measures a load (a force in the Z-axis direction) applied to the indenter 221 pressing the chip 14 by the load measuring instrument 223, and destroys the chip 14 by the indenter 221 while outputting a measurement result to the controller 400 as appropriate. The strength measuring unit 200 performs a three-point bending test with use of the pair of supporting portions supporting the chip 14 and the indenter 221, measures the bending strength (flexural strength) of the chip 14 in this three-point bending test, and outputs a measurement result to the controller 400.

In addition, the test apparatus 1 is provided with a tray installation portion 90 on which a housing tray 91 for housing a plurality of chips 14 as non-defective products is installed. In the embodiment, the tray installation portion 90 is provided on the apparatus main body 2 and at a position overlapping the movement path of the chip holder 63, and is disposed on the chip support base 114 side of the strength measuring unit 200.

The controller 400 controls each of the above-described various constituent units of the test apparatus 1, and thereby makes the test apparatus 1 perform a measurement operation on each chip 14 such as a measurement of the flexural strength of the chip 14. That is, the controller 400 controls each of the frame fixing unit 7, the thrust-up unit 40, the imaging camera 50, and the pickup mechanism 60 as the above-described various constituent units of the test apparatus 1 and the pickup apparatus 20, and thereby makes the pickup apparatus 20 perform a pickup operation of picking up a chip 14 from the wafer unit 17.

The controller 400 is a computer including an arithmetic processing unit including a microprocessor such as a central processing unit (CPU), a storage unit including a memory such as a read only memory (ROM) or a random access memory (RAM), and an input-output interface unit. The arithmetic processing unit of the controller 400 performs arithmetic processing according to a computer program stored in the storage unit, and outputs control signals for controlling the test apparatus 1 to the above-described various units of the test apparatus 1 via the input-output interface unit.

In addition, the controller 400 is connected with a display unit 300 (illustrated in FIG. 1) as display means including a display screen 301 that displays a state of the measurement operation, an image, or the like, and a touch panel 302 (illustrated in FIG. 1) as input means used when an operator inputs information or the like to the controller 400 of the test apparatus 1. The display unit 300 is constituted by a liquid crystal display apparatus or the like. The touch panel 302 is stacked on the display screen 301 of the display unit 300.

In addition, the controller 400 stores the positions of chips 14 as non-defective products and the positions of chips 14 as defective products in each of the plurality of wafer units 17 housed in the cassette 4.

In addition, as illustrated in FIG. 1 and FIG. 2, the controller 400 includes an operation control section 401, a saw mark detecting section 402, and a region classifying section 403.

The operation control section 401 controls each of the above-described various constituent units of the test apparatus 1, and thereby makes the test apparatus 1 perform a measurement operation on each chip 14 such as a measurement of the flexural strength of the chip 14. That is, the operation control section 401 controls each of the frame fixing unit 7, the thrust-up unit 40, the imaging camera 50, and the pickup mechanism 60 as the above-described various constituent units of the test apparatus 1 and the pickup apparatus 20, and thereby makes the pickup apparatus 20 perform a pickup operation of picking up a chip 14 from the wafer unit 17.

The saw mark detecting section 402 is a saw mark detecting unit that detects the saw marks 19 of the wafer 10 of the wafer unit 17. In the embodiment, the saw mark detecting section 402 calculates the shape and position of the saw marks 19 on the basis of processing conditions at a time of the grinding of the wafer 10 (for example, the outside diameter of the wafer 10, the outside diameter of the grinding wheel, the rotational direction and rotational speed of the chuck table, and the rotational direction and rotational speed of the grinding wheel).

Figure 10:
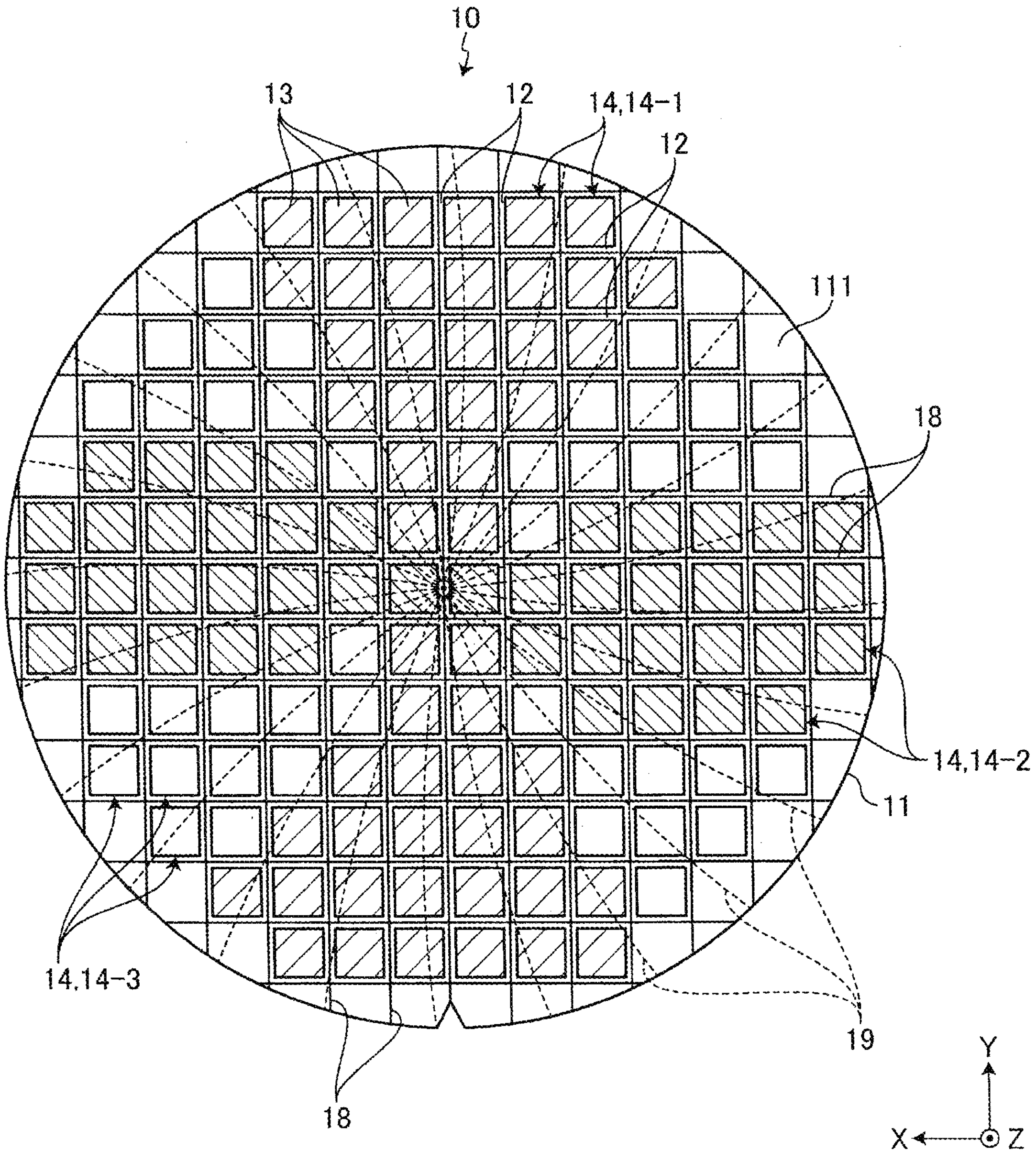
FIG. 10 is a plan view schematically illustrating the wafer classified into a plurality of regions by a region classifying section of a controller of the test apparatus illustrated in FIG. 1.

FIG. 10 is a plan view schematically illustrating the wafer classified into a plurality of regions by the region classifying section of the controller of the test apparatus illustrated in FIG. 1. The region classifying section 403 classifies the wafer 10 into a plurality of regions 14-1, 14-2, and 14-3 on the basis of the saw marks 19 of the wafer 10 detected by the saw mark detecting section 402. In the embodiment, as illustrated in FIG. 10, the region classifying section 403 classifies the wafer 10 into a first region 14-1 (indicated by coarse hatching in FIG. 10) in which the angles of tangents to saw marks 19 with respect to the X-axis direction are equal to or more than 45 degrees, a second region 14-2 (indicated by dense hatching in FIG. 10) in which the angles of tangents to saw marks 19 with respect to the X-axis direction are less than 45 degrees, and a third region 14-3 (indicated by a white background in FIG. 10) in which the angles of tangents to saw marks 19 with respect to the X-axis direction are 45 degrees.

In addition, in the embodiment, the region classifying section 403 respectively classifies chips 14 at least partly located in the first region 14-1 and the second region 14-2 as chips 14 located in the first region 14-1 and the second region 14-2, and classifies chips 14 not even partly located in the first region 14-1 and the second region 14-2 as chips 14 located in the third region 14-3. Thus, the region classifying section 403 classifies the chips 14 individually divided from the wafer 10 into chips 14 located in the first region 14-1, chips 14 located in the second region 14-2, and chips 14 located in the third region 14-3. As for the chips 14 located in the first region 14-1, the angles of tangents to all of saw marks 19 formed on the undersurface 112 with respect to the X-axis direction exceed 45 degrees. As for the chips 14 located in the second region 14-2, the angles of tangents to all of saw marks 19 formed on the undersurface 112 with respect to the X-axis direction are less than 45 degrees. As for the chips 14 located in the third region 14-3, the angles of tangents to at least a part of saw marks 19 formed on the undersurface 112 with respect to the X-axis direction are 45 degrees.

Incidentally, in the embodiment, the first region 14-1 is located at both end portions in the Y-axis direction of the wafer 10, the second region 14-2 is located at both end portions in the X-axis direction of the wafer 10, and the third region 14-3 is located between the first region 14-1 and the second region 14-2 along the circumferential direction of the wafer 10. In addition, the saw marks 19 in the first region 14-1 will hereinafter be described as parallel with the Y-axis direction, and the saw marks 19 in the second region 14-2 will hereinafter be described as parallel with the X-axis direction.

Incidentally, functions of the operation control section 401, the saw mark detecting section 402, and the region classifying section 403 are implemented by the arithmetic processing unit of the controller 400 by performing arithmetic processing according to the computer program stored in the storage unit.

Figure 11:
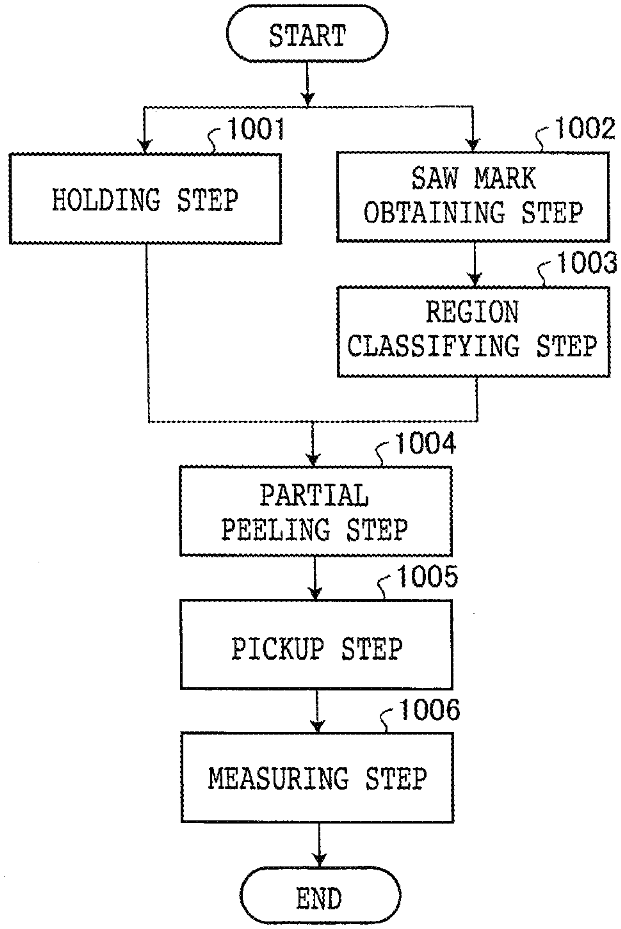
FIG. 11 is a flowchart illustrating a flow of a pickup method according to the embodiment.

Next, the present specification will describe a pickup method according to the embodiment with reference to the drawings. FIG. 11 is a flowchart illustrating a flow of the pickup method according to the embodiment. The pickup method is a method for picking up a chip 14 affixed to the tape 15 of the wafer unit 17 from the tape 15, and in the embodiment, the pickup method is also a method for the test apparatus to perform a measurement operation on the chip 14 picked up from the wafer unit 17, that is, a method for measuring the flexural strength of the chip 14. That is, in the embodiment, the pickup method is a measurement operation of the test apparatus 1.

The pickup method according to the embodiment is performed by the test apparatus 1 after the operator installs a cassette 4 housing a plurality of wafer units 17 on the cassette mounting base 3, and inputs measurement conditions to the controller 400 by operating the touch panel 302 and the controller 400 receives a measurement start instruction of the operator. Incidentally, the measurement conditions include the positions of chips 14 as non-defective products and the positions of chips 14 as defective products in each of the wafer units 17.

In the embodiment, the test apparatus 1 picks up chips 14 one by one in order from each of the wafer units 17. Incidentally, in the present specification, each time a chip 14 is to be picked up during the execution of the pickup method, the operator may select a chip 14 to be picked up from the tape 15 by operating the touch panel or the like. As illustrated in FIG. 11, the pickup method includes a holding step 1001, a saw mark obtaining step 1002, a region classifying step 1003, a partial peeling step 1004, a pickup step 1005, and a measuring step 1006.

Figure 12:
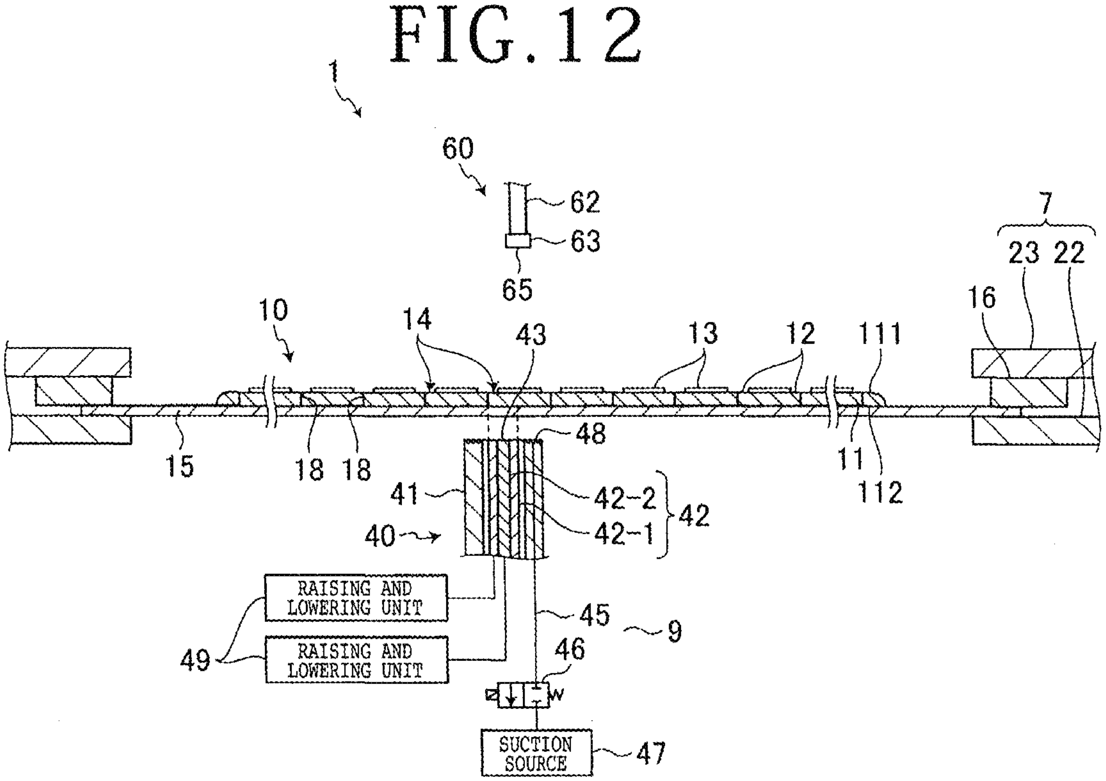
FIG. 12 is a side view schematically illustrating, partly in section, a holding step of the pickup method illustrated in FIG. 11.

FIG. 12 is a side view schematically illustrating, partly in section, the holding step of the pickup method illustrated in FIG. 11. The holding step 1001 is a step of holding, by the frame fixing unit 7, the frame 16 of a wafer unit 17, that is, the periphery of the chip 14 to be picked up on the tape 15.

In the holding step 1001, the operation control section 401 of the controller 400 controls the loading and unloading unit 5 to unload a wafer unit 17 including a wafer 10 before a test from the cassette 4 and temporarily place the wafer unit 17 on the pair of temporary placement rails 6, and controls the loading and unloading unit 5 to mount the frame 16 of the wafer unit 17 temporarily placed on the temporary placement rails 6 onto the lowered frame supporting member 22 of the frame fixing unit 7. In the holding step 1001, as illustrated in FIG. 12, the operation control section 401 of the controller 400 controls the frame fixing unit 7 to raise the frame supporting member 22, sandwich the frame 16, that is, the periphery of the chip 14 to be picked up on the tape 15 between the frame holding member 23 and the frame supporting member 22, and thereby fix the wafer unit 17 by the frame fixing unit 7.

The saw mark obtaining step 1002 is a step of obtaining the saw marks 19 of the wafer 10 before the partial peeling step 1004 is performed. In the embodiment, the saw mark obtaining step 1002 is performed by the saw mark detecting section 402 when the holding step 1001 is started. In the embodiment, in the saw mark obtaining step 1002, the saw mark detecting section 402 of the controller 400 calculates the shape and position of the saw marks 19 on the undersurface of the wafer 10 on the basis of processing conditions at a time of grinding processing.

The region classifying step 1003 classifies the wafer 10 into the plurality of regions 14-1, 14-2, and 14-3 on the basis of the saw marks 19 obtained in the saw mark obtaining step 1002. In the embodiment, in the region classifying step 1003, the region classifying section 403 of the controller 400 classifies the wafer 10 into the first region 14-1, the second region 14-2, and the third region 14-3 described above, and classifies the plurality of chips 14 into chips 14 located in the first region 14-1, chips 14 located in the second region 14-2, and chips 14 located in the third region 14-3.

Figure 13:
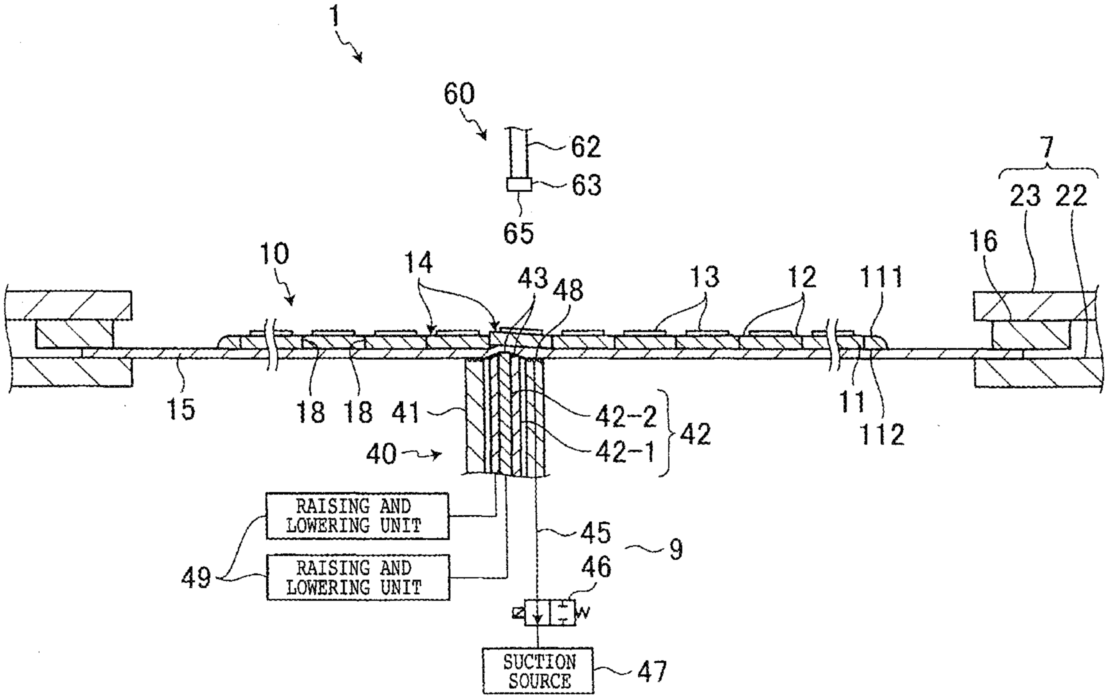
FIG. 13 is a side view schematically illustrating, partly in section, a partial peeling step of the pickup method illustrated in FIG. 11.
Figure 14:
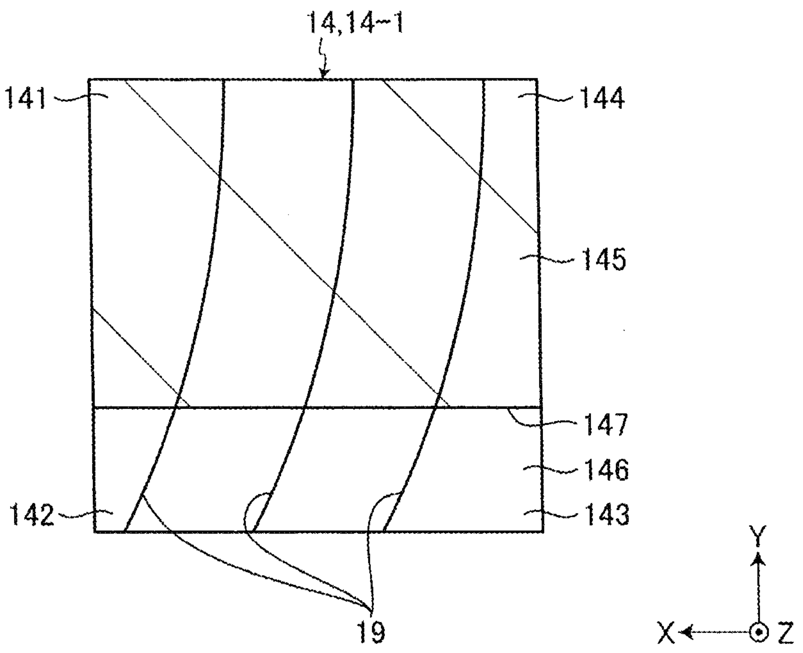
FIG. 14 is a plan view schematically illustrating a chip located in a first region after the partial peeling step of the pickup method illustrated in FIG. 11.
Figure 15:
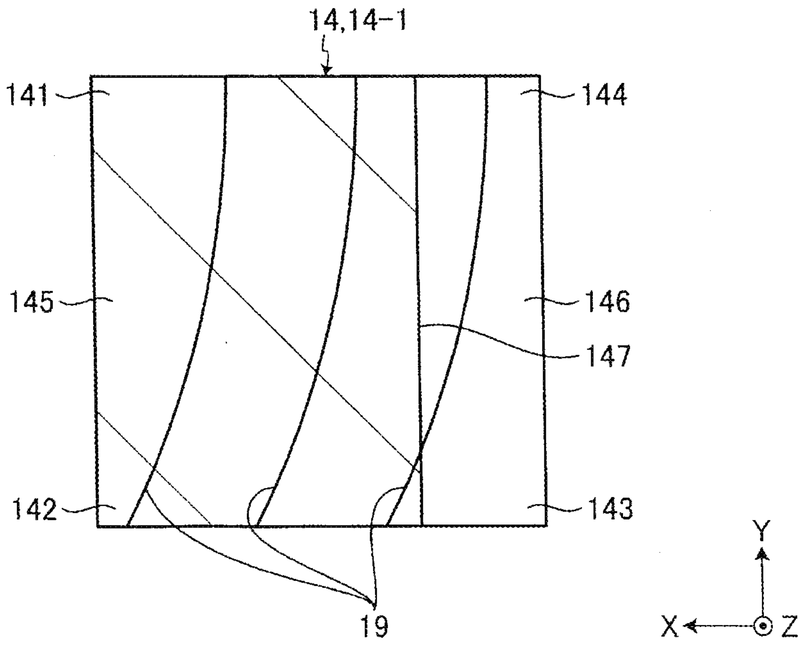
FIG. 15 is a plan view schematically illustrating a chip located in a first region of a comparative example.
Figure 16:
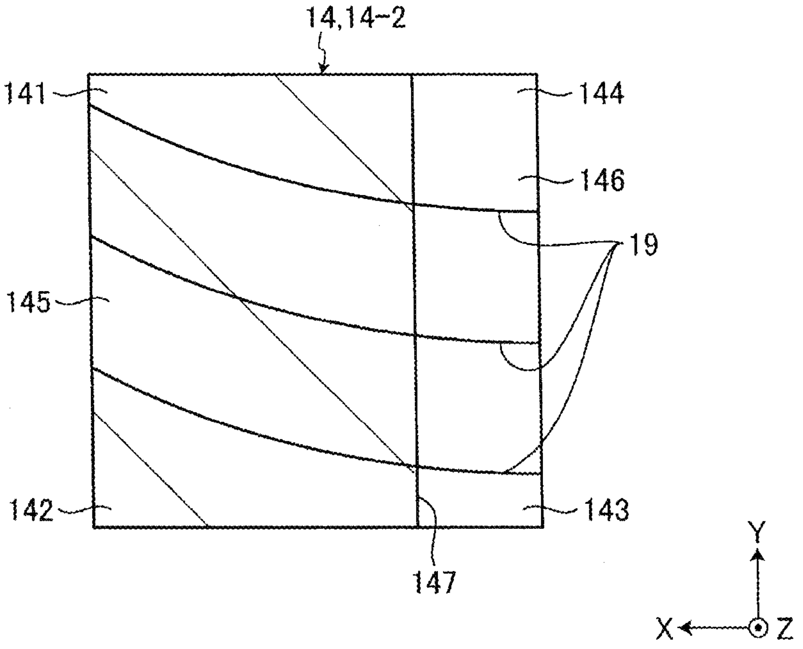
FIG. 16 is a plan view schematically illustrating a chip located in a second region after the partial peeling step of the pickup method illustrated in FIG. 11.
Figure 17:
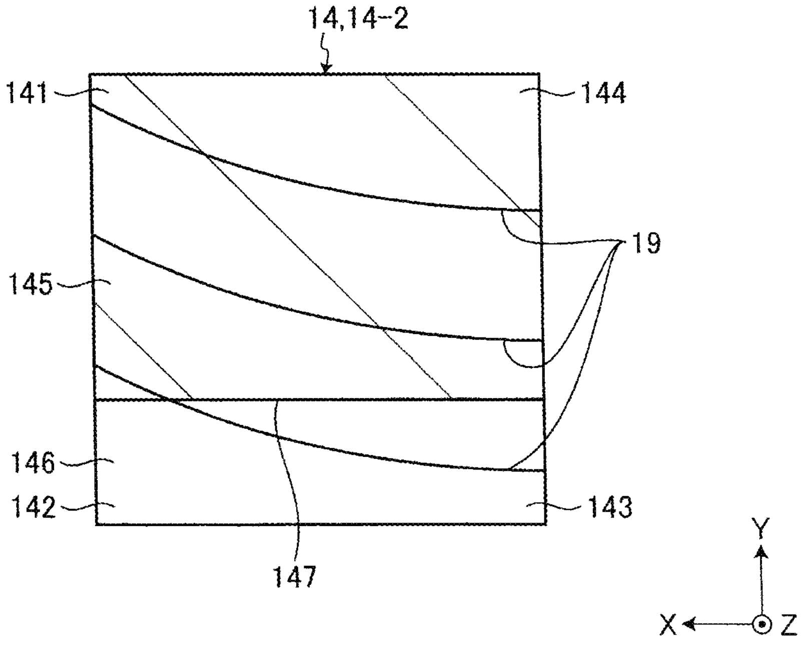
FIG. 17 is a plan view schematically illustrating a chip located in a second region of the comparative example.

FIG. 13 is a side view schematically illustrating, partly in section, the partial peeling step of the pickup method illustrated in FIG. 11. FIG. 14 is a plan view schematically illustrating a chip located in the first region after the partial peeling step of the pickup method illustrated in FIG. 11. FIG. 15 is a plan view schematically illustrating a chip located in a first region of a comparative example. FIG. 16 is a plan view schematically illustrating a chip located in the second region after the partial peeling step of the pickup method illustrated in FIG. 11. FIG. 17 is a plan view schematically illustrating a chip located in a second region of the comparative example.

The partial peeling step 1004 is a step of forming the peeled region 145 (indicated by hatching in FIG. 14 and FIG. 15 or the like) in which a part of a chip 14 is peeled from the tape 15 and the affixed region 146 (illustrated in FIG. 14 and FIG. 15) in which a part including a peripheral edge of the chip 14 is affixed to the tape 15, by thrusting up the chip 14 by the thrust-up members 42-1 and 42-2 via the tape 15 while sucking and holding the tape 15 on the outside of the chip 14 to be picked up. In the embodiment, in the partial peeling step 1004, after the holding step 1001, the saw mark obtaining step 1002, and the region classifying step 1003, the operation control section 401 of the controller 400 controls the moving mechanism 30 on the basis of measurement conditions to move the frame fixing unit 7 and thereby position the chip 14 to be picked up next in the wafer unit 17 held by the frame fixing unit 7 above the thrust-up unit 40 and below the imaging camera 50.

In the embodiment, in the partial peeling step 1004, the operation control section 401 of the controller 400 obtains a captured image by making the imaging camera 50 image the chip 14 in the wafer 10 of the wafer unit 17 fixed to the frame fixing unit 7 and the periphery of the chip 14. In the embodiment, in the partial peeling step 1004, the operation control section 401 of the controller 400 detects the position of the outer edge of the chip 14 to be picked up from the captured image, adjusts the position of the frame fixing unit 7 by controlling the moving mechanism 30, and thereby carries out alignment between the chip 14 to be picked up and the thrust-up unit 40.

In the embodiment, in the partial peeling step 1004, the operation control section 401 of the controller 400 controls the thrust-up unit 40 to raise the whole of the thrust-up unit 40 in a state in which the thrust-up members 42-1 and 42-2 are lowered, and bring the upper surface 48 of the tape holding unit 41 of the thrust-up unit 40 and the upper surfaces 43 of the thrust-up members 42-1 and 42-2 into contact with the tape 15. In addition, in the embodiment, in the partial peeling step 1004, the operation control section 401 of the controller 400 sucks and holds the tape 15 on the upper surface 48 of the tape holding unit 41 of the thrust-up unit 40 by opening the opening and closing valve 46, and supports the chip 14 to be picked up via the tape 15 by the thrust-up unit 42 of the thrust-up unit 40.

In the embodiment, in the partial peeling step 1004, the operation control section 401 of the controller 400 controls both of the raising and lowering units 49 of the thrust-up unit 40 to raise the thrust-up members 42-1 and 42-2, peel a part of the chip 14 to be picked up from the tape 15 by pressing and thrusting up the chip 14 to be picked up via the tape 15, as illustrated in FIG. 13, and thereafter lower the thrust-up members 42-1 and 42-2, and stops the sucking and holding of the tape 15 on the upper surface 48 by closing the opening and closing valve 46. In the embodiment, at a time of thrusting up the chip 14 via the tape 15 by the thrust-up members 42-1 and 42-2 in the partial peeling step 1004, the operation control section 401 of the controller 400 controls both of the raising and lowering units 49 of the thrust-up unit 40 to raise the thrust-up members 42-1 and 42-2 simultaneously at a same speed, stop raising the first thrust-up member 42-1, then raise the second thrust-up member 42-2 to a position above the first thrust-up member 42-1, and then stop raising the second thrust-up member 42-2.

In addition, in the embodiment, in the partial peeling step 1004, the operation control section 401 of the controller 400 controls the moving mechanism 30 to change the position at which the thrust-up members 42-1 and 42-2 thrust up the chip 14, and repeats the sucking and holding of the tape 15 by the upper surface 48, the raising and lowering of the thrust-up members 42-1 and 42-2, and the stopping of the sucking and holding of the tape 15 by the upper surface 48. The operation control section 401 thereby presses and thrusts up at least a part of four corners 141, 142, 143, and 144 of the chip 14 by the thrust-up members 42-1 and 42-2, and consequently forms the peeled region 145 and the affixed region 146.

In the embodiment, in the partial peeling step 1004, the operation control section 401 of the controller 400 presses and thrusts up one of corners arranged in the X-axis direction among the four corners 141, 142, 143, and 144 of a chip 14 located in the first region 14-1 by the thrust-up members 42-1 and 42-2 via the tape 15. For example, in the embodiment, in the partial peeling step 1004, as illustrated in FIG. 14, the operation control section 401 of the controller 400 presses and thrusts up one corner 141 of the corners 141 and

144 arranged in the X-axis direction among the four corners 141, 142, 143, and 144 of the chip 14 located in the first region 14-1 by the thrust-up members 42-1 and 42-2 via the tape 15 and presses and thrusts up another corner 144 by the thrust-up members 42-1 and 42-2 via the tape 15, and does not press the other corners 142 and 143 arranged in the X-axis direction by the thrust-up members 42-1 and 42-2.

Thus, in the embodiment, in the partial peeling step 1004, as illustrated in FIG. 14, the operation control section 401 of the controller 400 peels a part of the chip 14 such that a boundary line 147 between the peeled region 145 in which the chip 14 is peeled from the tape 15 and the affixed region 146 in which the chip 14 is affixed to the tape 15 intersects saw marks 19.

As opposed to such an embodiment, in the pickup method of the comparative example, when the operation control section 401 of the controller 400 presses and thrusts up one of corners arranged in the Y-axis direction among the four corners 141, 142, 143, and 144 of the chip 14 located in the first region 14-1 by the thrust-up members 42-1 and 42-2 via the tape 15, the boundary line 147 between the peeled region 145 in which the chip 14 is peeled from the tape 15 and the affixed region 146 in which the chip 14 is affixed to the tape 15 is parallel with the saw marks 19, as illustrated in FIG. 15. Incidentally, in the present specification, the boundary line 147 intersecting the saw mark 19 indicates that angles formed between the boundary line 147 and tangents to the saw marks 19 exceed 45 degrees, and the boundary line 147 being parallel with the saw marks 19 indicates that the angles formed between the boundary line 147 and the tangents to the saw marks 19 are less than 45 degrees.

In the embodiment, in the partial peeling step 1004, the operation control section 401 of the controller 400 presses and thrusts up one of corners arranged in the Y-axis direction among the four corners 141, 142, 143, and 144 of a chip 14 located in the second region 14-2 by the thrust-up members 42-1 and 42-2 via the tape 15. For example, in the embodiment, in the partial peeling step 1004, as illustrated in FIG. 16, the operation control section 401 of the controller 400 presses and thrusts up one corner 141 of the corners 141 and 142 arranged in the Y-axis direction among the four corners 141, 142, 143, and 144 of the chip 14 located in the second region 14-2 by the thrust-up members 42-1 and 42-2 via the tape 15 and presses and thrusts up another corner 142 by the thrust-up members 42-1 and 42-2 via the tape 15, and does not press the other corners 143 and 144 arranged in the Y-axis direction by the thrust-up members 42-1 and 42-2.

Thus, in the embodiment, in the partial peeling step 1004, as illustrated in FIG. 16, the operation control section 401 of the controller 400 peels a part of the chip 14 such that the boundary line 147 between the peeled region 145 in which the chip 14 is peeled from the tape 15 and the affixed region 146 in which the chip 14 is affixed to the tape 15 intersects saw marks 19.

In addition, in the embodiment, in the partial peeling step 1004, as illustrated in FIG. 14 and FIG. 16, the operation control section 401 of the controller 400 raises the thrust-up members 42-1 and 42-2 by a raising amount at which a central portion of the chip 14 is also peeled from the tape 15. Thus, in the embodiment, in the partial peeling step 1004, the pickup apparatus 20 forms the peeled region 145 also in the central portion of the undersurface 112 of the chip 14.

As opposed to such an embodiment, in the pickup method of the comparative example, when the operation control section 401 of the controller 400 presses and thrusts up one of corners arranged in the X-axis direction among the four corners 141, 142, 143, and 144 of the chip 14 located in the second region 14-2 by the thrust-up members 42-1 and 42-2 via the tape 15, the boundary line 147 between the peeled region 145 in which the chip 14 is peeled from the tape 15 and the affixed region 146 in which the chip 14 is affixed to the tape 15 is parallel with the saw marks 19, as illustrated in FIG. 17.

Thus, in the embodiment, in the partial peeling step 1004, the pickup apparatus 20 positions the thrust-up unit 40 at a chip 14 to be picked up and thrusts up the chip 14 such that the boundary line 147 between the peeled region 145 and the affixed region 146 of the chip 14 intersects saw marks 19. In addition, in the embodiment, in the partial peeling step 1004, the pickup apparatus 20 positions the thrust-up members 42-1 and 42-2 of the thrust-up unit 40 at a same position with respect to the chips 14 and thrusts up the chips 14 in each of the regions 14-1 and 14-2 classified in the region classifying step 1003, and peels parts of the chips 14 from the tape 15 such that the boundary line 147 between the peeled region 145 and the affixed region 146 intersects saw marks 19.

In addition, in the embodiment, in the partial peeling step 1004, the operation control section 401 of the controller 400 presses and thrusts up the same positions of the chips 14 located in the third region 14-3 as those of the chips 14 in the first region 14-1 or the second region 14-2 by the thrust-up members 42-1 and 42-2 via the tape 15.

Incidentally, in the present invention, the positions pressed by the thrust-up members 42-1 and 42-2 and raising amounts at a time of the thrusting up of the thrust-up members 42-1 and 42-2 in the partial peeling step 1004 are set as appropriate according to the materials of the chips 14, the size of the chips 14, and the thickness of the chips 14.

Figure 18:
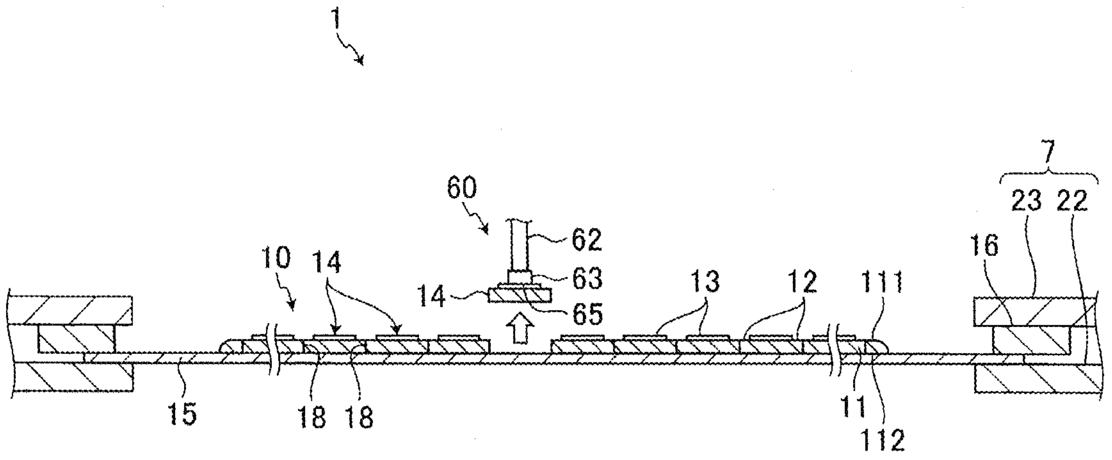
FIG. 18 is a side view schematically illustrating, partly in section, a pickup step of the pickup method illustrated in FIG. 11.

FIG. 18 is a side view schematically illustrating, partly in section, the pickup step of the pickup method illustrated in FIG. 11. The pickup step 1005 is a step of, following the partial peeling step 1004, peeling the whole area of the chip 14 to be picked up from the tape 15 and picking up the chip 14 by holding the peeled region 145 of the chip 14 by the chip holder 63 and lifting the chip 14 in a direction in which the chip 14 is separated from the tape 15.

In the embodiment, in the pickup step 1005, the operation control section 401 of the controller 400 controls the moving mechanism 30 to adjust the position of the frame fixing unit 7 and controls the holder moving unit 80 to move the chip holder 63, and thereby carries out alignment between the chip 14 to be picked up after being subjected to the partial peeling step 1004 in the wafer 10 and the chip holder 63. Incidentally, in the embodiment, the alignment makes the center of the chip 14 and the lower surface 65 of the chip holder 63 face each other along the vertical direction.

In the embodiment, in the pickup step 1005, the operation control section 401 of the controller 400 makes the lower surface 65 of the chip holder 63 abut against a central portion of the top surface 111 of the chip 14 by lowering the chip holder 63. In the embodiment, in the pickup step 1005, the operation control section 401 of the controller 400 sucks the lower surface 65 of the chip holder 63 by the suction source by opening the opening and closing valve, thereby makes a negative pressure act on the lower surface 65, and thus sucks and holds the central portion of the top surface 111 of the chip 14 on the lower surface 65.

In the embodiment, in the pickup step 1005, as illustrated in FIG. 18, the operation control section 401 of the controller 400 controls the holder moving unit 80 to raise the chip holder 63, thereby pick up the chip 14 sucked and held on the lower surface 65 of the chip holder 63 from the tape 15, and take out the chip 14 from the tape 15. Thus, in the pickup step 1005, the pickup apparatus 20 peels the affixed region

146 of the chip 14 from the tape 15 and picks up the chip 14 by moving the chip holder 63 holding the peeled region 145 of the chip 14 in a direction in which the chip holder 63 is separated from the tape 15.

Besides, in the present invention, in the pickup step 1005, in addition to the sucking and holding of the peeled region 145 of the chip 14 and the picking up of the chip 14 by the chip holder 63 after the partial peeling step 1004, the peeled region 145 of the chip 14 (the center of the chip 14) may be sucked and held by the chip holder 63 while the center of the chip 14 is thrust up by the thrust-up members 42-1 and 42-2 in the partial peeling step 1004. In this case, the chip 14 to be picked up may be picked up by the chip holder 63 while the tape 15 on the periphery of the chip 14 to be picked up is sucked and held. In this case, in the pickup step 1005, the sucked and held top surface of the chip 14 can be made parallel with the lower surface 65 of the chip holder 63. Sucking and holding the top surface of the chip 14 in a state in which the sucked and held top surface of the chip 14 is made parallel with the lower surface 65 of the chip holder 63 can reduce a risk of damaging the chip 14 at the time of the sucking and holding.

The measuring step 1006 is a step of obtaining an image by imaging at least one of the top surface 111, the undersurface 112, and the side surfaces of the chip 14 supported by the chip holder 63 by the chip observation mechanism 100, and transporting the chip 14 supported by the chip holder 63 to the housing tray 91 in a case where the chip 14 is a non-defective product, or transporting the chip 14 to the measurement position and measuring the flexural strength of the chip 14 by the strength measuring unit 200 in a case where the chip 14 is a defective product.

In the embodiment, in the measuring step 1006, the operation control section 401 of the controller 400 controls the holder moving unit 80 to move the chip holder 63 as appropriate, controls the chip observation mechanism 100 to image the top surface 111, the undersurface 112, and the side surfaces specified by measurement conditions and obtain these images, and stores the images in the storage unit in association with the position in the wafer 10 on a one-to-one basis. In the embodiment, in the measuring step 1006, the operation control section 401 of the controller 400 refers to measurement conditions stored in advance and determines whether the chip 14 supported by the chip holder 63 is a non-defective product or a defective product, and in a case where the picked-up chip 14 is a non-defective product, the operation control section 401 controls the holder moving unit 80 to move the chip holder 63 to the housing tray 91, and make the chip 14 housed in the housing tray 91.

In addition, in the measuring step 1006, the operation control section 401 of the controller 400 refers to the measurement conditions stored in advance and determines whether the chip 14 supported by the chip holder 63 is a non-defective product or a defective product, and in a case where the picked-up chip 14 is a defective product, the operation control section 401 controls the holder moving unit 80 to move the chip holder 63 to the measurement position, and mount the undersurface 112 of the chip 14 onto the pair of supporting portions of the supporting unit 210 of the strength measuring unit 200.

In the embodiment, in the measuring step 1006, the operation control section 401 of the controller 400 controls the strength measuring unit 200 to lower the indenter 221 by the indenter moving unit 222, bring a distal end of the indenter 221 into contact with the top surface 111 side of the chip 14, and press the chip 14 by the indenter 221. In addition, a load (a force in the Z-axis direction) applied to the indenter 221 by the pressing of the chip 14 is measured by the load measuring instrument 223, and a measurement result is output to the controller 400 as appropriate.

In the measuring step 1006, the operation control section 401 of the controller 400 controls the strength measuring unit 200 to further lower the indenter 221, and destroy the chip 14. When the chip 14 is destroyed, the load measured by the load measuring instrument 223 changes from a maximum value to zero. The strength measuring unit 200 can therefore detect a timing in which the chip 14 is destroyed from the change in the value of the load measured by the load measuring instrument 223. In addition, the maximum value of the load measured by the load measuring instrument 223 corresponds to the flexural strength of the chip 14. In the measuring step 1006, the operation control section 401 of the controller 400 calculates the flexural strength of the destroyed chip 14 on the basis of the maximum value of the load or the like, and stores the calculated flexural strength in the storage unit in association with the position in the wafer 10 and the images obtained by the chip observation mechanism 100 described earlier on a one-to-one basis.

The operation control section 401 of the controller 400 of the test apparatus 1 repeats the partial peeling step 1004, the pickup step 1005, and the measuring step 1006. The operation control section 401 thereby picks up, in order, chips 14 specified by measurement conditions from the wafer 10 of the wafer unit 17 fixed by the frame fixing unit 7, and transports the picked-up chips 14 to the housing tray 91 or destroys the chips 14 to calculate the flexural strengths thereof. After the operation control section 401 of the controller 400 of the test apparatus 1 picks up all of the chips 14 specified by the measurement conditions from the wafer 10 of the wafer unit 17 fixed by the frame fixing unit 7, the operation control section 401 houses the wafer unit 17 from which all of the chips 14 specified by the measurement conditions have been picked up into the cassette 4. After the operation control section 401 of the controller 400 of the test apparatus 1 performs the pickup of all of the chips 14 from the wafers 10 of the wafer units 17 specified by measurement conditions and the like by repeating the partial peeling step 1004, the pickup step 1005, and the measuring step 1006, the operation control section 401 ends the measurement operation, that is, the pickup method according to the embodiment.

In the partial peeling step 1004, when a part of a chip 14 is peeled from the tape 15 by using the thrust-up unit 40 in which the planar shape of the thrust-up members 42-1 and 42-2 is smaller than the planar shape of the chip 14 and the boundary line 147 is formed in parallel with the saw marks 19 as illustrated in FIG. 15 and FIG. 17, damage such as cracking of the chip 14 along the saw marks 19 may occur at a time of picking up the chip 14 from the tape 15 by the chip holder 63 in the pickup step 1005. As opposed to such a case, the pickup method and the pickup apparatus 20 according to the embodiment peel a part of the chip 14 from the tape 15 by use of the thrust-up unit 40 in which the planar shape of the thrust-up members 42-1 and 42-2 is smaller than the planar shape of the chip 14 and make the boundary line 147 intersect the saw marks 19, as illustrated in FIG. 14 and FIG. 16. It is therefore possible to suppress the cracking of the chip 14 along the saw marks 19 at the time of picking up the chip 14 from the tape 15 by the chip holder 63 in the pickup step 1005.

Hence, the pickup method and the pickup apparatus 20 according to the embodiment make the boundary line 147 intersect the saw marks 19 even when peeling a part of the chip 14 from the tape 15 by use of the thrust-up unit 40 in which the planar shape of the thrust-up members 42-1 and 42-2 is smaller than the planar shape of the chip 14 in the partial peeling step 1004. It is therefore possible to pick up the chip 14 from the tape 15 while suppressing damage.

In addition, because the pickup method and the pickup apparatus 20 according to the embodiment use the thrust-up unit 40 in which the planar shape of the thrust-up members 42-1 and 42-2 is smaller than the planar shape of the chip 14, it is not necessary to replace the thrust-up members 42-1 and 42-2 according to the size and shape of the chips 14.

As a result, the pickup method and the pickup apparatus 20 according to the embodiment produce an effect of being able to pick up the thinned chip 14 from the tape 15 without any damage to the thinned chip 14 and without replacement of the thrust-up members 42-1 and 42-2.

In addition, in the pickup method and the pickup apparatus 20 according to the embodiment, it suffices for each of the upper surfaces 43 as pressing surfaces of the thrust-up members 42-1 and 42-2 and the lower surface 65 as a holding surface of the chip holder 63 to be in the same planar shape as the chip 14 to be picked up or smaller than the planar shape of the chip 14. As a result, the pickup method and the pickup apparatus 20 according to the embodiment eliminate a need for the replacement of the chip holder 63 (that is, can pick up chips 14 of a plurality of sizes by the same chip holder 63) because the lower surface 65 as the holding surface of the chip holder 63 is smaller than the planar shape of the chip 14.

In addition, conventionally, all of the four corners 141, 142, 143, and 144 of the chip 14 are peeled from the tape 15 by thrusting up all of the four corners 141, 142, 143, and 144 of the chip 14, the thrust-up members 42-1 and 42-2 reach a thrust-up position while the central portion of the chip 14 affixed to the tape 15 is sandwiched by the chip holder 63 and the thrust-up members 42-1 and 42-2 (that is, the thrust-up members 42-1 and 42-2 are raised, and the chip holder 63 is also raised at a same speed), and thereafter the chip 14 is lifted while the chip 14 is sucked and held by the chip holder 63. In this case, when the thickness of the chip 14 is small, that is, equal to or less than 30 μm, and all of the four corners 141, 142, 143, and 144 of the chip 14 are thrust up, the corners 141, 142, 143, and 144 of the thrust-up chip 14 are warped (bent), and are gradually peeled from the tape 15. It is therefore difficult to hold the central portion of the chip 14 in a state of being affixed to the tape 15. In addition, when the whole of the undersurface 112 of the chip 14 is peeled, the chip 14 is moved at a time of sucking and holding the chip 14 by the chip holder 63, and the orientation of the picked-up chip 14 is displaced. In this case, the chip 14 cannot be mounted in a predetermined orientation in the strength measuring unit 200, so that an accurate measurement cannot be made. In addition, in the case where the chip 14 is thin, even if the central portion of the chip 14 can be retained in the affixed state by reducing the raising amounts of the thrust-up members 42-1 and 42-2 or the like, the central portion is not peeled from the tape 15 when the affixed region is thrust up while being sandwiched by the chip holder 63 and the thrust-up members 42-1 and 42-2, and the chip 14 is cracked when being sucked and held by the chip holder 63 (only a sucked region is peeled from the tape 15).

However, in the pickup method and the pickup apparatus 20 according to the embodiment, the chip holder 63 sucks and holds the central portion of the chip 14, that is, the top surface 111 side of the peeled region 145 in the pickup step 1005. It is therefore possible to suppress damage to the chip 14 when picking up the chip 14 from the tape 15. In addition, in the pickup method and the pickup apparatus 20 according to the embodiment, the chip holder 63 sucks and holds the central portion of the chip 14 in which the affixed region 146 is formed, that is, which is partly affixed to the tape 15, that is, the top surface 111 side of the peeled region 145 in the pickup step 1005. Thus, a positional displacement such as a rotation of the chip 14 at the time of picking up the chip 14 can be suppressed, so that the positioning of the chip 14 at the transportation destination is facilitated. That is, the pickup method and the pickup apparatus 20 according to the embodiment hold the same position of each of the chips 14, and therefore eliminate a need for the adjustment of an amount of movement to the mounting destination or the angle of each of the chips 14.

It is to be noted that the present invention is not limited to the foregoing embodiment and the like. That is, the present invention can be variously modified and carried out without departing from the gist of the present invention. In the embodiment, the test apparatus 1 measures the flexural strength of the chip 14. However, in the present invention, the test apparatus 1 is not limited to the chip 14, but may measure the strength of various test specimens. In addition, in the embodiment, the pickup apparatus 20 constitutes a part of the test apparatus 1. However, in the present invention, the pickup apparatus 20 is not limited to this, but may be a single body without constituting another apparatus such as the test apparatus 1.

In addition, in the present invention, the region classifying section 403 classifies the wafer 10 into the first region 14-1, the second region 14-2, and the third region 14-3 in the region classifying step 1003. However, in the present invention, it suffices to classify the wafer 10 into at least the first region 14-1 and the second region 14-2.

In addition, in the present invention, an imaging camera may be provided which is disposed in the recessed portion 9 of the apparatus main body 2, and images the undersurface 112 of the wafer 10 of the wafer unit 17 fixed by the frame fixing unit 7, and the saw mark detecting section 402 may detect the saw marks 19 on the basis of the image of the undersurface 112 of the wafer 10 captured by the imaging camera.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A pickup apparatus for picking up a chip affixed to a tape from the tape, the pickup apparatus comprising:

a thrust-up unit including a tape holding unit having a suction region configured to suck and hold the tape on an outside of the chip to be picked up and a raisable and lowerable thrust-up member disposed inside the suction region and having a pressing surface smaller than the chip to be picked up at a distal end of the thrust-up member, the thrust-up unit being configured to form a peeled region in which a part of the chip is peeled from the tape and form an affixed region in which a part of the chip is affixed to the tape, by thrusting up the chip via the tape, the peeled region including a central portion of the chip and the affixed region including an outer peripheral edge of the chip; and a holder that is disposed on a side facing the thrust-up unit with the chip to be picked up interposed between the holder and the thrust-up unit, and has a holding surface smaller than the chip, the holding surface being configured to hold the peeled region of the chip thrust up by the thrust-up unit, wherein1 the affixed region of the chip is peeled from the tape and the chip is picked up by moving the holder holding the peeled region of the chip in a direction in which the chip is separated from the tape.

2. The pickup apparatus according to claim 1, wherein:

the chip has saw marks, and the thrust-up unit is positioned at the chip and thrusts up the chip such that a boundary line between the peeled region and the affixed region of the chip to be picked up intersects the saw marks.

3. The pickup apparatus according to claim 2, further comprising:

a controller configured to control the thrust-up unit and the holder; and a saw mark detecting section configured to detect saw marks of a wafer;

wherein the controller includes a region classifying section configured to classify the wafer into a plurality of regions on a basis of the saw marks of the wafer, and in each of the regions classified by the region classifying section, the thrust-up unit is positioned at a same position with respect to the chip and thrusts up the chip, and the chip is peeled such that the boundary line between the peeled region and the affixed region intersects the saw marks.

4. The pickup apparatus according to claim 1, wherein the peeled region includes a first side of the chip and the affixed region includes a second side of the chip opposite to the first side.

5. The pickup apparatus according to claim 1, further comprising:

a controller configured to control the thrust-up unit and the holder such that, after the thrust-up member is lowered and suction holding of the tape by the tape holding unit is stopped, the holding surface is brought into contact with the peeled region.

6. A pickup apparatus for picking up a chip affixed to a tape from the tape, the pickup apparatus comprising:

a thrust-up unit including a tape holding unit having a suction region configured to suck and hold the tape on an outside of the chip to be picked up and a raisable and lowerable thrust-up member disposed inside the suction region and having a pressing surface smaller than the chip to be picked up at a distal end of the thrust-up member, the thrust-up unit being configured to form a peeled region in which a part of the chip is peeled from the tape and form an affixed region in which a part of the chip is affixed to the tape, by thrusting up the chip via the tape;

a holder that is disposed on a side facing the thrust-up unit with the chip to be picked up interposed between the holder and the thrust-up unit, and has a holding surface smaller than the chip, the holding surface being configured to hold the peeled region of the chip thrust up by the thrust-up unit;

a controller configured to control the thrust-up unit and the holder; and a saw mark detecting section configured to detect saw marks of a wafer, wherein:

the affixed region of the chip is peeled from the tape and the chip is picked up by moving the holder holding the peeled region of the chip in a direction in which the chip is separated from the tape;

the chip has saw marks, the thrust-up unit is positioned at the chip and thrusts up the chip such that a boundary line between the peeled region and the affixed region of the chip to be picked up intersects the saw marks, the controller includes a region classifying section configured to classify the wafer into a plurality of regions on a basis of the saw marks of the wafer, and in each of the regions classified by the region classifying section, the thrust-up unit is positioned at a same position with respect to the chip and thrusts up the chip, and the chip is peeled such that the boundary line between the peeled region and the affixed region intersects the saw marks.

* * * * *